(12) United States Patent
Wu

(10) Patent No.: US 11,996,291 B2
(45) Date of Patent: *May 28, 2024

(54) METHOD FOR MANUFACTURING SEMICONDUCTOR DEVICE INCLUDING ANNEALING A GERMANIUM LAYER TO DIFFUSE GERMANIUM ATOMS INTO A SILICON SUBSTRATE

(71) Applicant: TAIWAN SEMICONDUCTOR MANUFACTURING CO., LTD., Hsinchu (TW)

(72) Inventor: Cheng-Hsien Wu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/850,867

(22) Filed: Jun. 27, 2022

(65) Prior Publication Data
US 2022/0328315 A1 Oct. 13, 2022

Related U.S. Application Data

(63) Continuation of application No. 16/455,370, filed on Jun. 27, 2019, now Pat. No. 11,373,870.

(51) Int. Cl.
| | |
|---|---|
| *H01L 21/225* | (2006.01) |
| *H01L 21/762* | (2006.01) |
| *H01L 29/66* | (2006.01) |
| *H01L 29/78* | (2006.01) |
| *H01L 21/02* | (2006.01) |
| *H01L 21/3065* | (2006.01) |

(52) U.S. Cl.
CPC .... *H01L 21/2254* (2013.01); *H01L 21/76224* (2013.01); *H01L 29/66795* (2013.01); *H01L 29/785* (2013.01); *H01L 21/02532* (2013.01); *H01L 21/02592* (2013.01); *H01L 21/02631* (2013.01); *H01L 21/3065* (2013.01)

(58) Field of Classification Search
CPC ......... H01L 21/76224; H01L 21/02532; H01L 21/2254; H01L 21/7624; H01L 21/02631; H01L 21/02592; H01L 21/3065; H01L 29/66795; H01L 29/785; H01L 29/1054
USPC ........................................................ 257/401
See application file for complete search history.

(56) References Cited

U.S. PATENT DOCUMENTS

| | | |
|---|---|---|
| 7,265,008 B2 | 9/2007 | King |
| 8,106,381 B2 | 1/2012 | Atanackovic |
| 8,877,608 B2 * | 11/2014 | Di ..................... H01L 21/76254 |
| | | 438/458 |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |

(Continued)

*Primary Examiner* — Khiem D Nguyen
(74) *Attorney, Agent, or Firm* — Maschoff Brennan

(57) ABSTRACT

A method for manufacturing a semiconductor device is provided. The method includes depositing a germanium layer over a silicon substrate; forming an oxide capping layer over the germanium layer; after forming the oxide capping layer, annealing the germanium layer to diffuse germanium atoms of the germanium layer into the silicon substrate, such that a portion of the silicon substrate is turned into a silicon germanium layer; and forming a gate structure over the silicon germanium layer.

20 Claims, 46 Drawing Sheets

(56) References Cited

U.S. PATENT DOCUMENTS

| | | | |
|---|---|---|---|
| 9,245,980 B2* | 1/2016 | Akarvardar | H01L 29/66795 |
| 9,391,172 B2 | 7/2016 | Hwang et al. | |
| 9,425,051 B2* | 8/2016 | Vinet | H01L 21/2225 |
| 9,472,460 B1* | 10/2016 | Reznicek | H01L 29/66795 |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,685,510 B2 | 6/2017 | Balakrishnan | |
| 9,780,214 B2 | 10/2017 | Huang | |
| 9,799,513 B2* | 10/2017 | Basker | H01L 21/02694 |
| 9,799,736 B1 | 10/2017 | Ebrish | |
| 9,806,176 B2 | 10/2017 | Dal | |
| 9,935,011 B2* | 4/2018 | Ching | H01L 21/823437 |
| 10,079,181 B2* | 9/2018 | Cheng | H01L 29/1079 |
| 10,361,306 B2* | 7/2019 | Ebrish | H01L 29/165 |
| 10,396,182 B2 | 8/2019 | Bedell | |
| 10,510,889 B2* | 12/2019 | More | H01L 29/1054 |
| 11,373,870 B2* | 6/2022 | Wu | H01L 21/76224 |
| 2008/0029828 A1* | 2/2008 | Oh | H01L 29/78645 257/E21.444 |
| 2011/0097863 A1 | 4/2011 | Shieh et al. | |
| 2014/0054548 A1 | 2/2014 | Pillarisetty | |
| 2014/0061735 A1 | 3/2014 | Witters | |
| 2015/0054121 A1 | 2/2015 | He | |
| 2015/0108585 A1 | 4/2015 | Loubet | |
| 2015/0194525 A1 | 7/2015 | Xu | |
| 2015/0206875 A1* | 7/2015 | Lee | H01L 21/823481 257/192 |
| 2016/0013308 A1 | 1/2016 | Lee | |
| 2016/0254178 A1 | 9/2016 | Guo et al. | |
| 2017/0012113 A1* | 1/2017 | Park | H01L 21/02532 |
| 2017/0125552 A1 | 5/2017 | Tung | |
| 2017/0207217 A1* | 7/2017 | Hellings | H01L 21/823431 |
| 2017/0229544 A1 | 8/2017 | Leobandung et al. | |
| 2017/0229545 A1* | 8/2017 | Balakrishnan | H01L 21/823878 |
| 2018/0026038 A1 | 1/2018 | Ching et al. | |
| 2018/0090573 A1 | 3/2018 | Balakrishnan et al. | |
| 2018/0145076 A1 | 5/2018 | Wang et al. | |
| 2018/0301534 A1 | 10/2018 | He et al. | |
| 2018/0323082 A1 | 11/2018 | Do | |
| 2018/0337098 A1 | 11/2018 | Ando | |
| 2019/0067446 A1 | 2/2019 | Ching et al. | |
| 2019/0097020 A1 | 3/2019 | Zhou | |
| 2019/0157156 A1* | 5/2019 | Chen | H01L 21/76224 |
| 2019/0319113 A1 | 10/2019 | Yu | |
| 2020/0287047 A1 | 9/2020 | Kuo | |

* cited by examiner

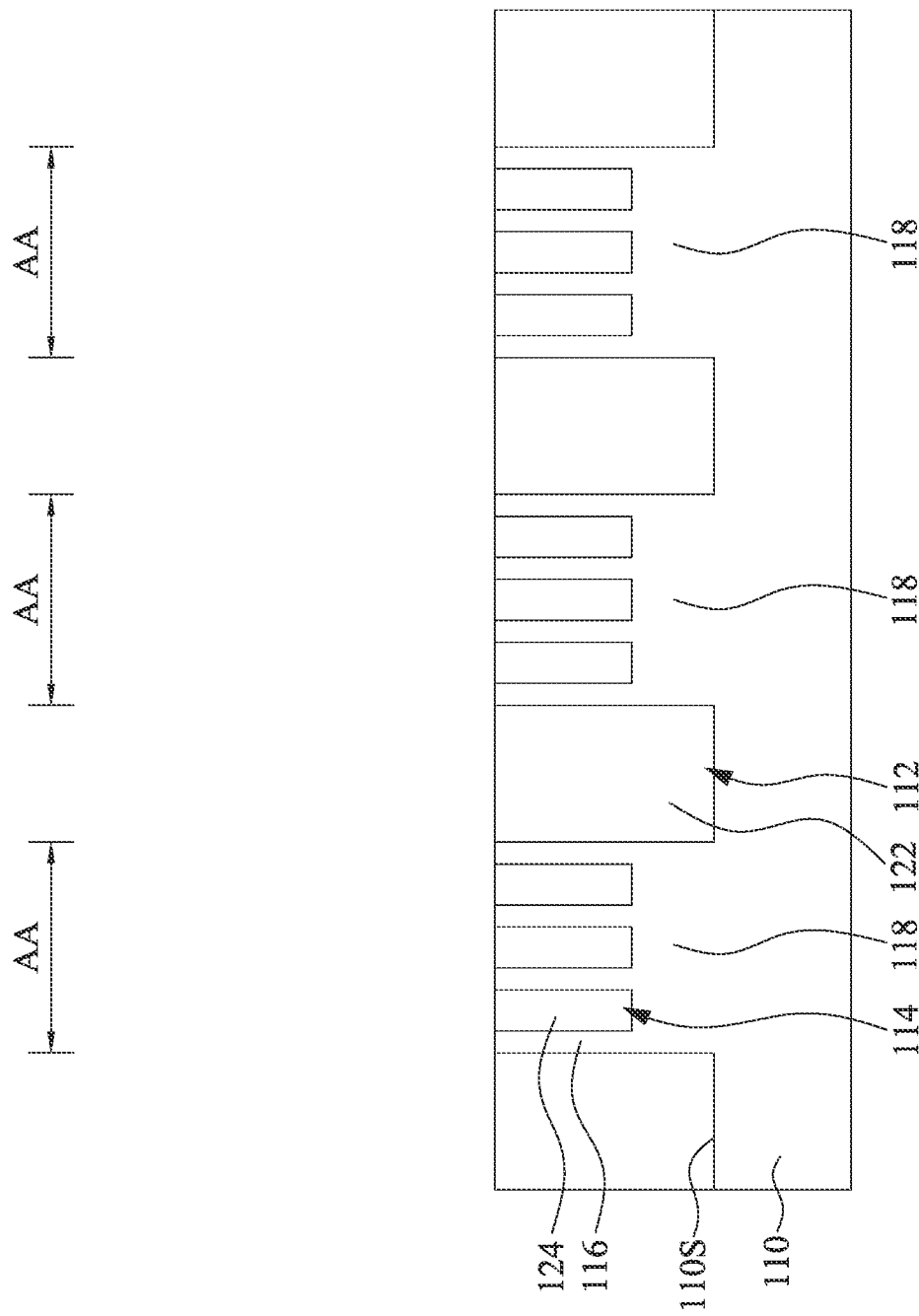

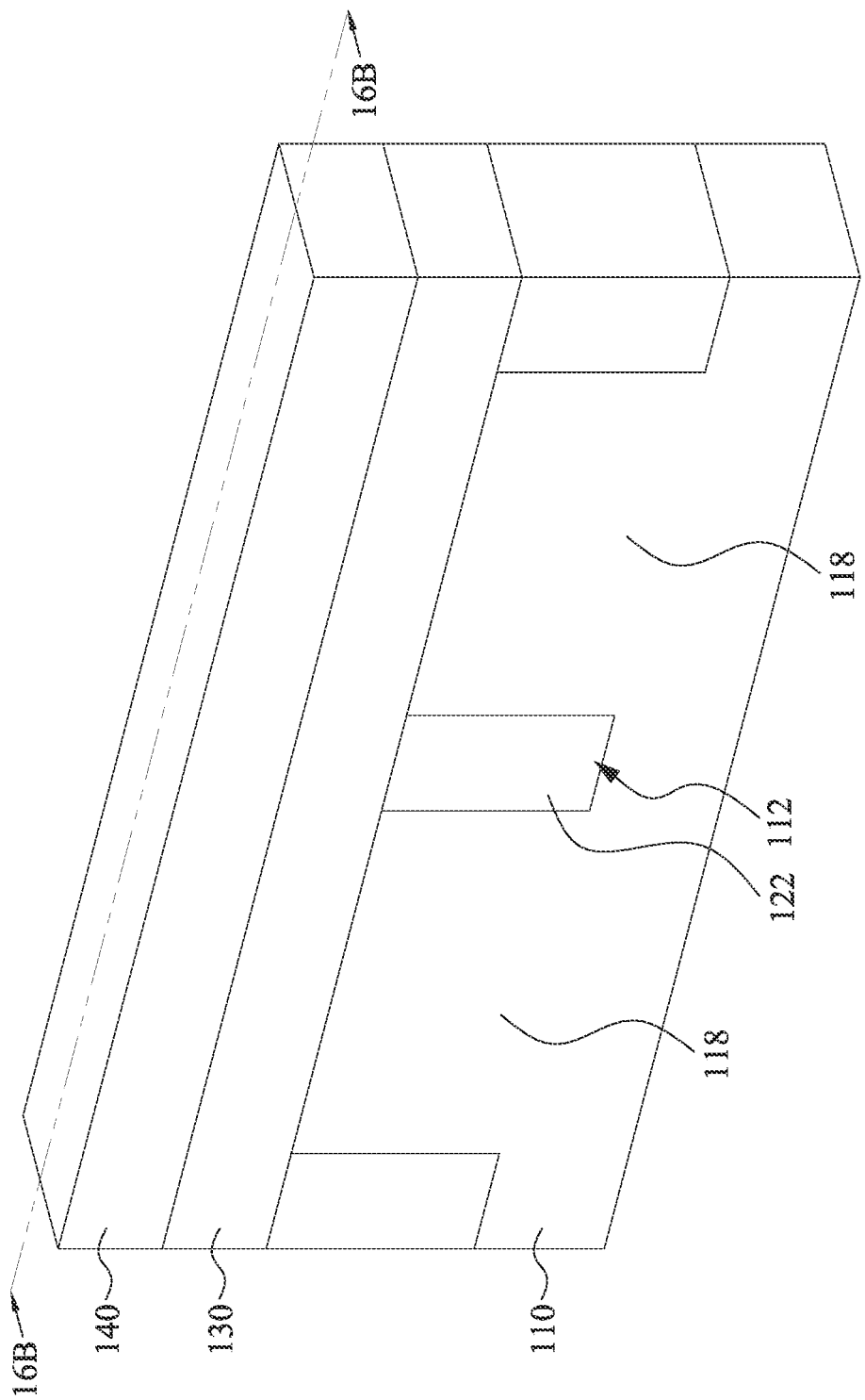

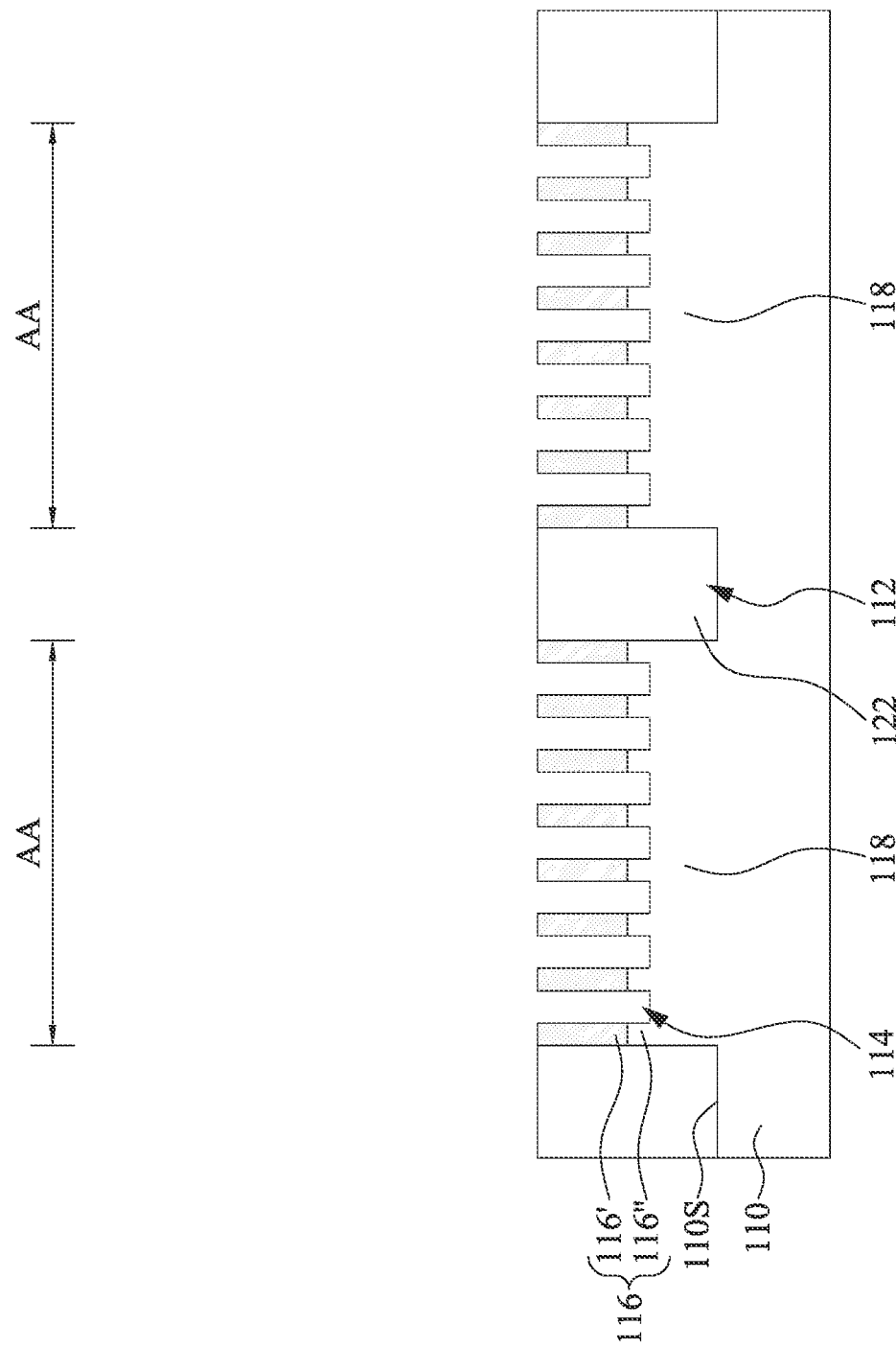

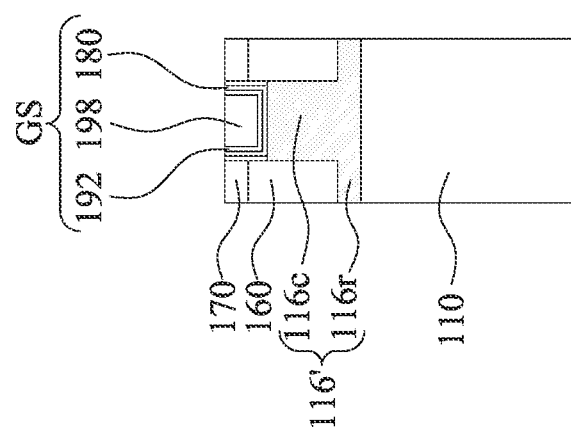

METHOD FOR MANUFACTURING SEMICONDUCTOR DEVICE INCLUDING ANNEALING A GERMANIUM LAYER TO DIFFUSE GERMANIUM ATOMS INTO A SILICON SUBSTRATE

PRIORITY CLAIM AND CROSS-REFERENCE

This application is a continuation of U.S. patent application Ser. No. 16/455,370, filed Jun. 17, 2019, now U.S. Pat. No. 11,373,870, issued on Jun. 28, 2022, the entirety of which is incorporated by reference herein in its entirety.

BACKGROUND

The semiconductor integrated circuit (IC) industry has experienced rapid growth. Over the course of this growth, functional density of the devices has generally increased while the device feature size or geometry has decreased. This scaling down process generally provides benefits by increasing production efficiency, lowering costs, and/or improving performance. Such scaling down has also increased the complexities of processing and manufacturing ICs and, for these advances to be realized similar developments in IC fabrication are needed. Likewise, the demand for increased performance and shrinking geometry from ICs has brought the introduction of multi-gate devices. These multi-gate devices include multi-gate fin-type transistors, also referred to as FinFET devices, because the channel is formed on a "fin" that extends from the substrate. FinFET devices may allow for shrinking the gate width of the device while providing a gate on the sides and/or top of the fin including the channel region.

In addition, with the use of high-k dielectric materials in the gate dielectrics of MOS transistors, the convenience provided by using silicon oxide is no longer a big advantage, and hence germanium is reexamined for use in integrated circuits. Recent studies of using germanium in Fin field-effect transistors (FinFETs) have been reported. However, the technology and materials for processing silicon germanium, for example, selecting and controlling the chemicals for processing and forming silicon germanium, are still being explored.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
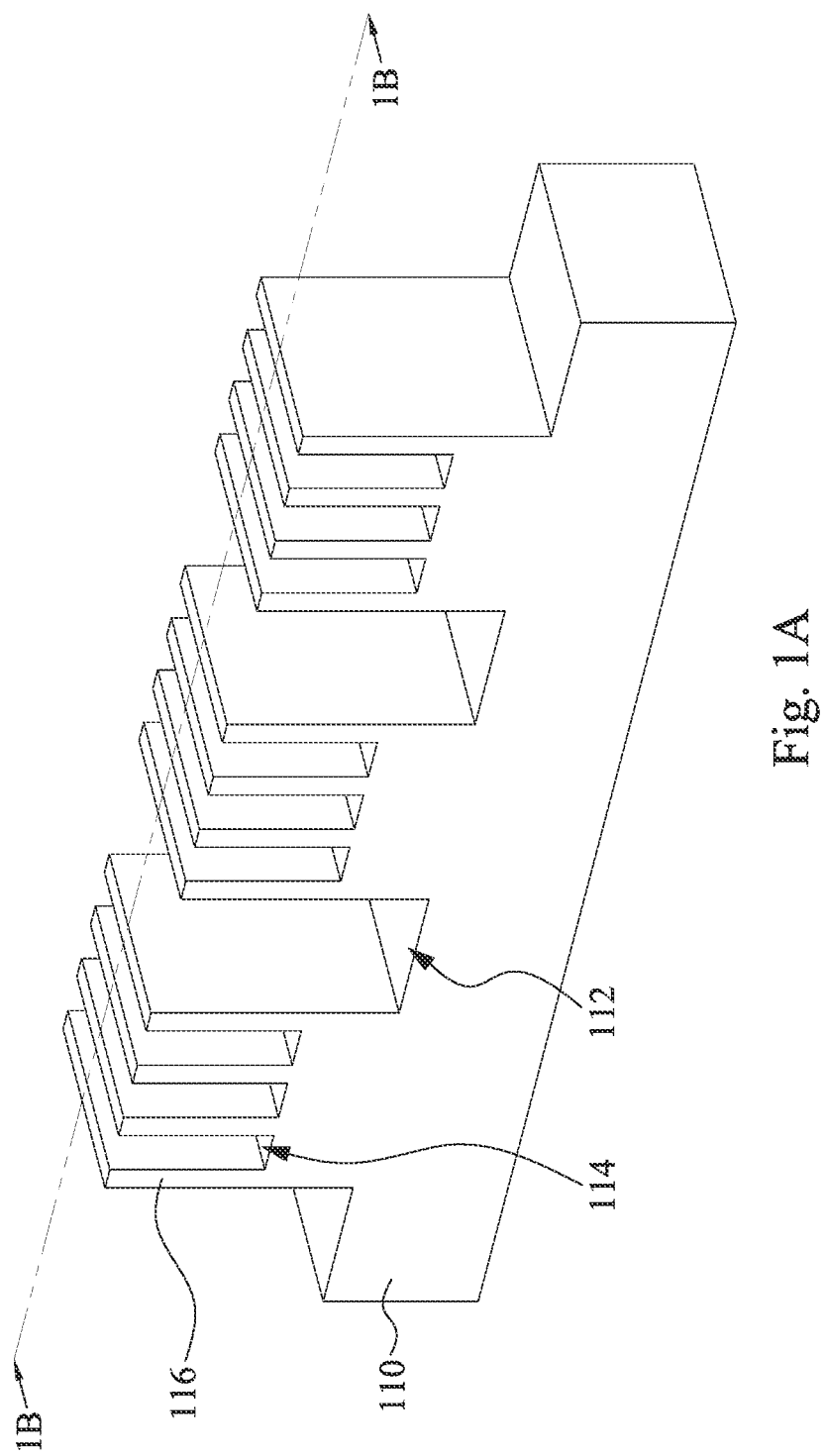
FIGS. 1A-11C illustrate a method of manufacturing a semiconductor device at various stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present disclosure. It is understood, however, that the application should not be limited to a particular type of device, except as specifically claimed.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1B:
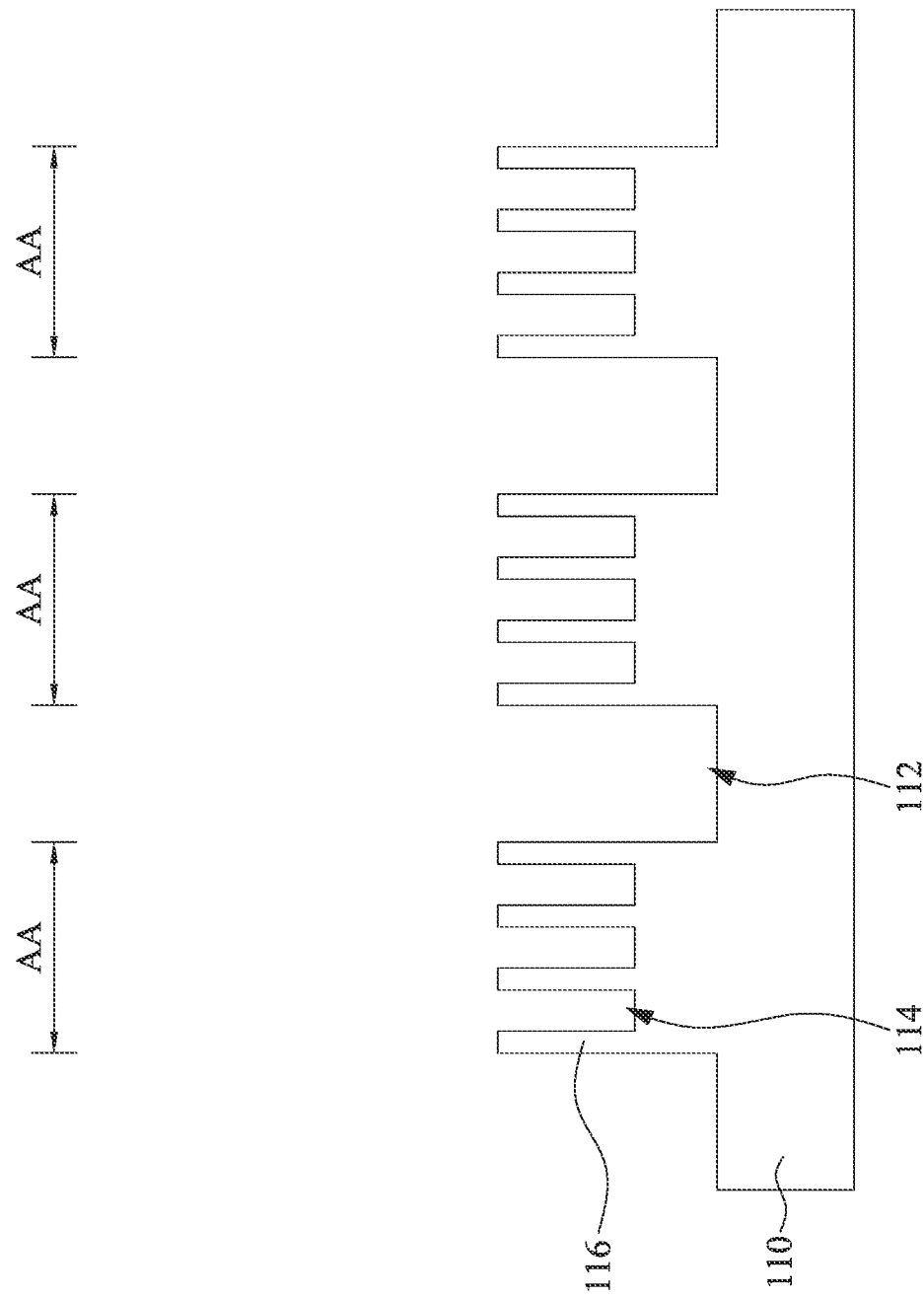

FIGS. 1A-11C illustrate a method of manufacturing a semiconductor device at various stages in accordance with some embodiments. Reference is made to FIGS. 1A and 1B. FIG. 1B is a cross-sectional view taken along line 1B-1B of FIG. 1A. A substrate 110 is provided. The substrate 110 may be a bulk silicon substrate. Alternatively, the substrate 110 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 110 also include a silicon-on-insulator (SOI) substrate. SOI substrates are fabricated using separation by implantation of oxygen (SIMOX), wafer bonding, and/or other suitable methods.

Trenches 112 are formed in the substrate 110 for defining areas AA of the substrate 110. The trenches 112 may be formed using a masking layer (not shown) along with a suitable etching process. For example, the masking layer may be a hardmask including silicon nitride formed through a process such as chemical vapor deposition (CVD), although other materials, such as oxides, oxynitrides, silicon carbide, combinations of these, or the like, and other processes, such as plasma enhanced CVD (PECVD), low pressure CVD (LPCVD), or even silicon oxide formation followed by nitridation, may alternatively be utilized. Once formed, the masking layer may be patterned through a suitable photolithographic process to expose those portions of the substrate 110. The exposed portions of the substrate 110 may be removed through a suitable process such as reactive ion etching (RIE) in order to form the trenches 112 in the substrate 110, although other suitable processes may alternatively be used.

Trenches 114 are formed in the areas AA for defining individual fins 116 in the areas AA from those portions of the substrate 110 that remain unremoved. These semiconductor fins 116 may be used, as discussed below, to form the channel region of the semiconductor device. The trenches 114 may be formed using a similar process as the trenches 112 such as a suitable masking or photolithography process followed by an etching process. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Additionally, during the formation of the trenches 114, the trenches 112 may be deepened, such that the trenches 112 extend into the substrate 110 a further distance than the trenches 114. That is, the trenches 112 are deeper than the trenches 114, and a bottom surface of the trenches 112 is lower than a bottom surface of the trenches 114. This may be done by using a suitable mask to expose both the trenches 112 as well as those areas of the substrate 110 that will be removed to form the trenches 114. It is noted that although in FIGS. 1A and 1B the trenches 112 and 114 have sharp corners, in some other embodiments, the trenches 112 and 114 may have round corners depending on the etching conditions.

However, as one of ordinary skill in the art will recognize, the process described above to form the trenches 112 and 114 is one potential process, and is not meant to be limited with this respect. Rather, other suitable process through which the trenches 112 and 114 may be formed such that the trenches 112 extend into the substrate 110 further than the trench 114 may be utilized. For example, the trenches 112 may be formed in a single etch step and then protected during the formation of the trenches 114. Other suitable process, including any number of masking and removal processes may alternatively be used.

The substrate 110 may also include various doped regions. The doped regions may be doped with p-type dopants, such as boron or $BF_2$; n-type dopants, such as phosphorus or arsenic; or combinations thereof. The doped regions may be formed directly on the substrate 110, in a P-well structure, in an N-well structure, in a dual-well structure, and/or using a raised structure. The substrate 110 may further include various active regions, such as regions configured for an N-type metal-oxide-semiconductor transistor device and regions configured for a P-type metal-oxide-semiconductor transistor device.

Figure 2A:
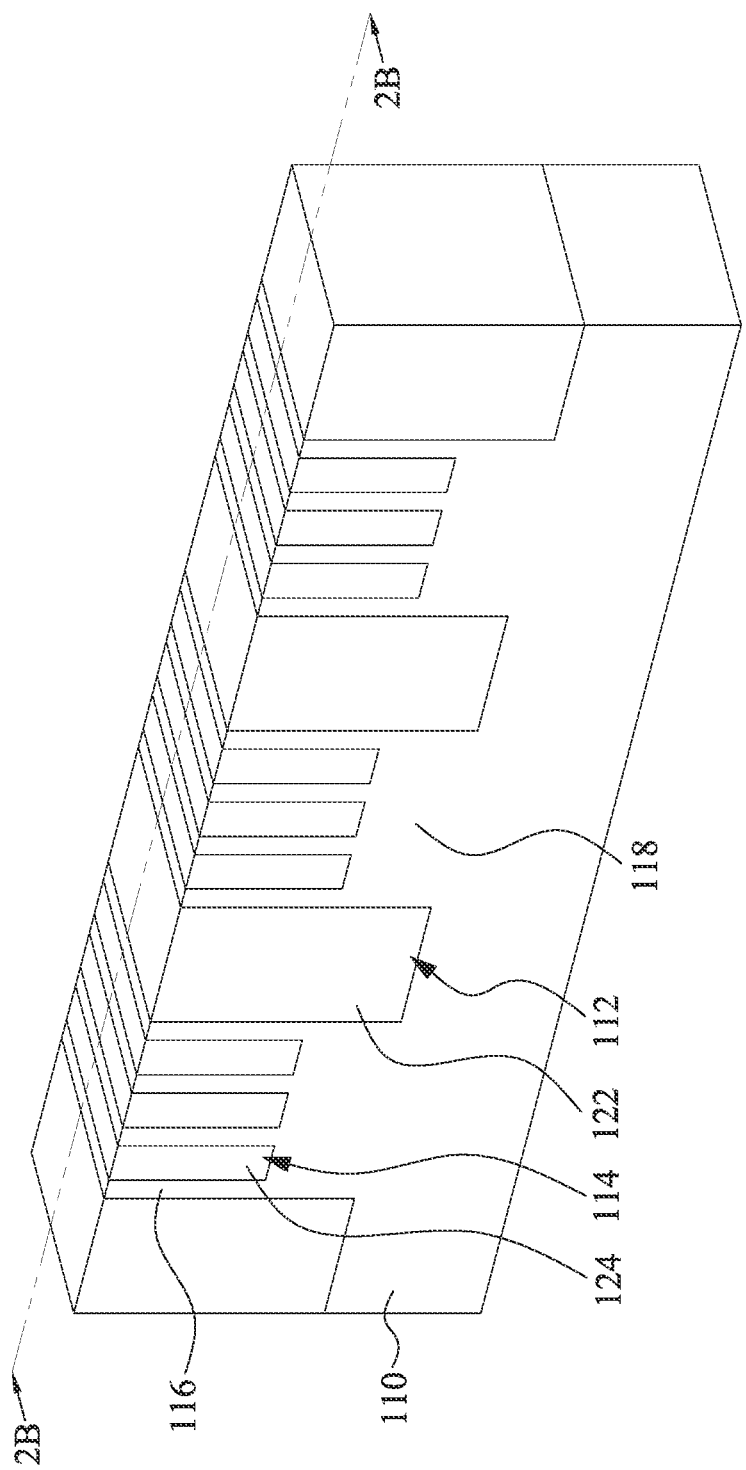

Reference is made to FIGS. 2A and 2B. FIG. 2B is a cross-sectional view taken along line 2B-2B of FIG. 2A. The trenches 112 and 114 are overfilled with a dielectric material, and then a planarization process is performed to remove portions of the dielectric material out of the trenches 112 and 114, such that top surfaces of the semiconductor fins 116 are exposed. The dielectric material respectively forms inter-device isolation structures 122 in the trenches 112 and intra-device isolation structures 124 in the trenches 114. In some embodiments, the inter-device isolation structures 122 extend into the substrate 110 further than the intra-device isolation structures 124. In other words, a bottom surface of the inter-device isolation structures 122 is lower than a bottom surface of the intra-device isolation structures 124. The inter-device isolation structures 122 define protruding portions 118 in the areas AA of the substrate 110. The protruding portions 118 protrude outward from a surface 110S of the semiconductor substrate 110 as plateaus. The intra-device isolation structures 124 define a plurality of the semiconductor fins 116 on the protruding portions 118, which may be referred to as crown structures. The dielectric material may be an oxide material, a high-density plasma (HDP) oxide, or the like. The dielectric material may be formed, after an optional cleaning and lining of the trenches 112 and 114, using a CVD method (e.g., the high aspect ratio process (HARP) process), a high-density plasma CVD method, or other suitable method of formation as is known in the art. The planarization process may include a chemical-mechanical polish (CMP) process.

Silicon germanium channel has high performance due to the improved mobility resulting from the germanium enriched channel. In some cases, silicon germanium fins may be formed by recessing the portions of the silicon substrate between the isolation structures 122 and 124 to form recesses, epitaxially growing silicon germanium in the recesses, and then recessing the isolation structures 122 and 124 so that the epitaxially grown silicon germanium becomes silicon germanium fins. This approach, however, involves etching the silicon substrate and hetero-epitaxially growing silicon germanium on the etched silicon substrate, in which the etching process may results kinks at corners, and thereby causing epitaxial defects after the hetero-epi-taxy. In some embodiments of the present disclosure, the silicon germanium fins is formed without etching the silicon substrate, which is illustrated in following.

Figure 3A:
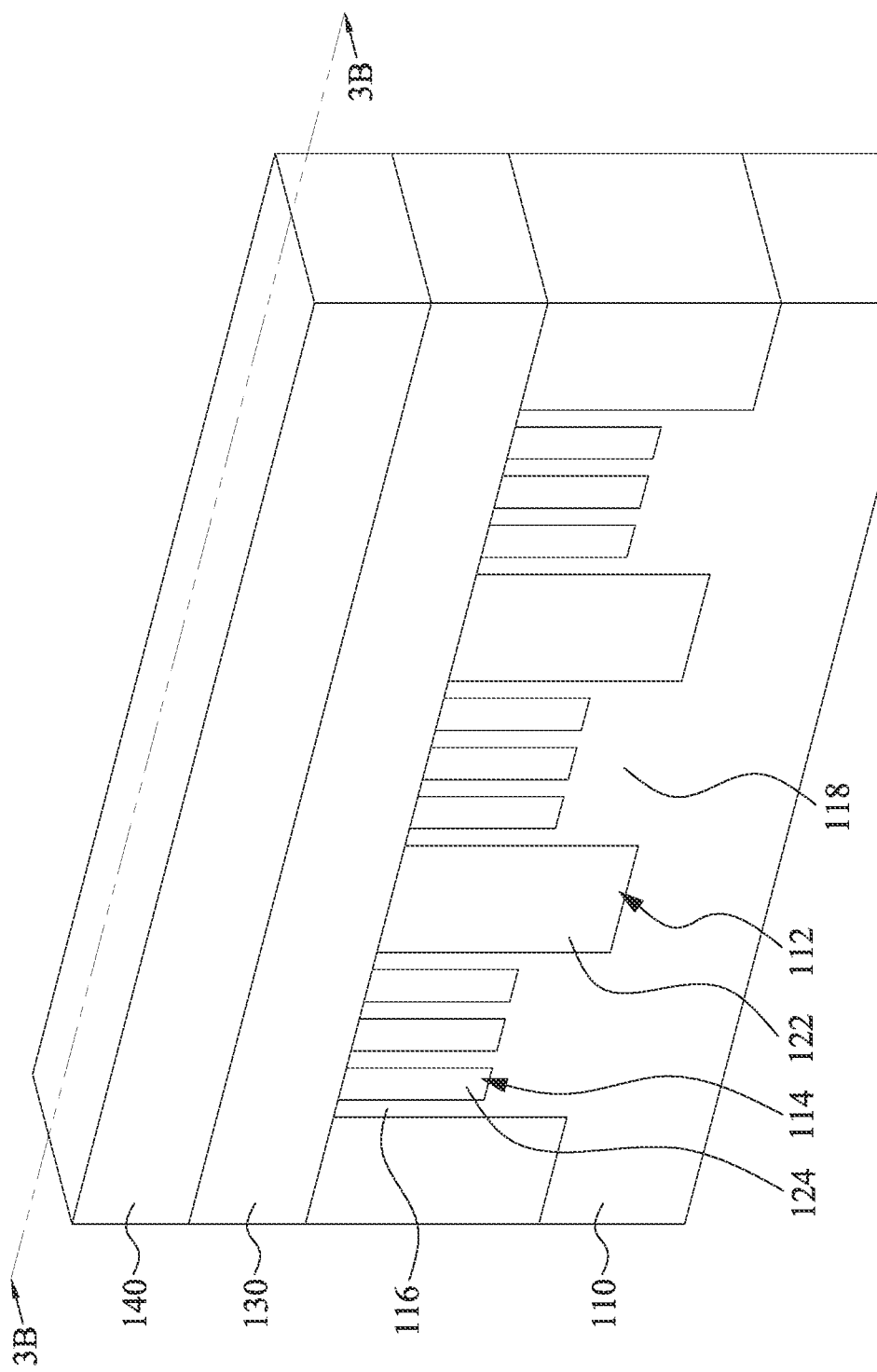
Figure 3B:
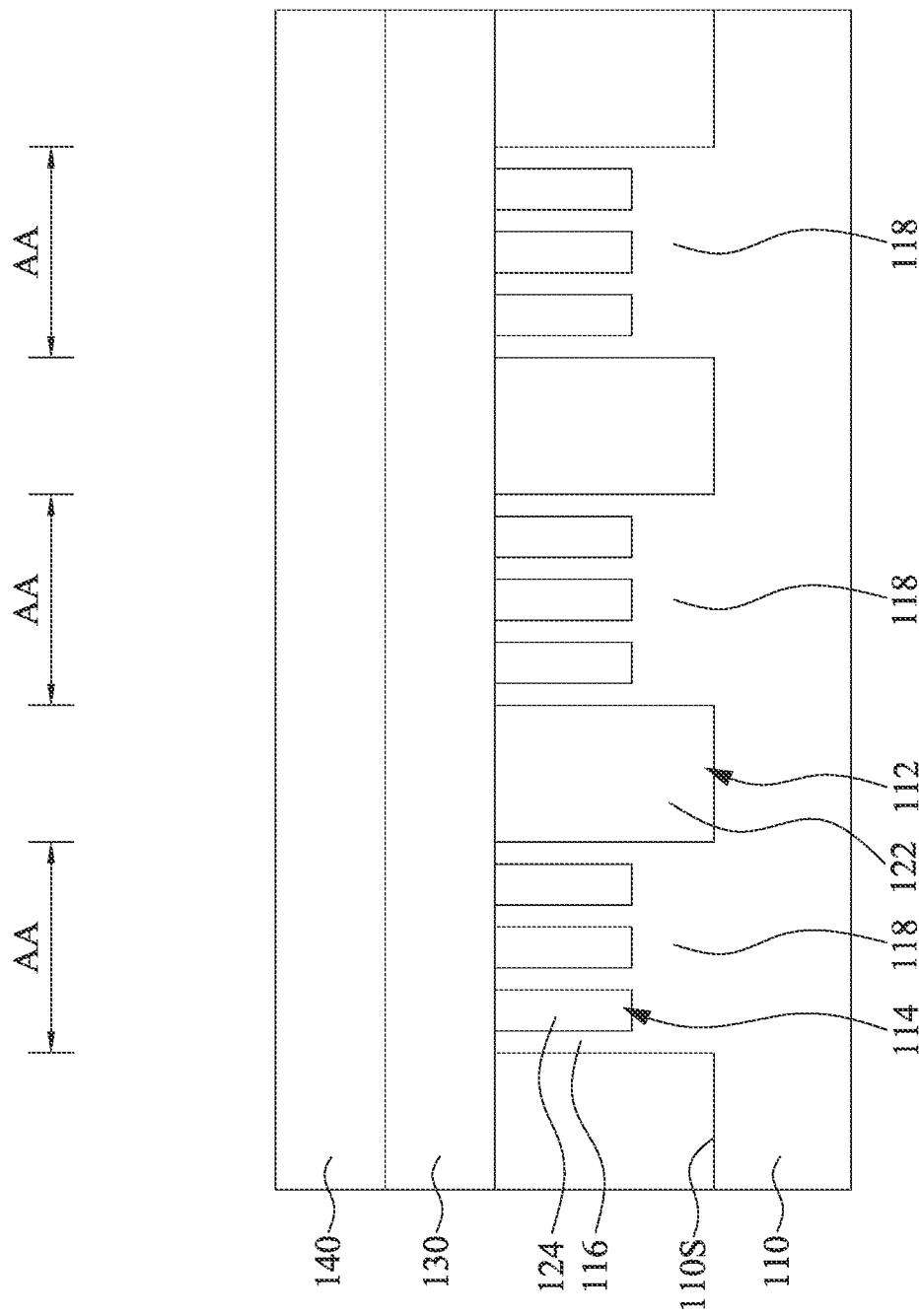

Reference is made to FIGS. 3A and 3B. FIG. 3B is a cross-sectional view taken along line 3B-3B of FIG. 3A. A semiconductor layer 130 is formed over the exposed top surface of the semiconductor fins 116 and top surfaces of the isolation structures 122 and 124 in an amorphous state. The amorphous semiconductor layer 130 is formed by, for example, physical vapor deposition, such as sputtering (e.g., radio frequency (RF) sputtering process) or evaporation. In some embodiments where the substrate 110 include Si, the semiconductor layer 130 may be made of germanium (Ge), silicon germanium (SiGe), GaAs, InGaAs, InAs, GaN, InP, GaSb, or the like. For example, the semiconductor layer 130 may be an amorphous germanium (a-Ge) layer. The semiconductor layer 130 may also be referred to as a sputter deposited amorphous layer. A thickness of the semiconductor layer 130 may be in a range from about 10 nm to about 1 um. If the thickness of the semiconductor layer 130 is less than 10 nm, the semiconductor layer 130 may not provide enough germanium atoms. If the thickness of the semiconductor layer 130 is greater than 1 um, it may take a long to remove the semiconductor layer 130 in subsequent process. In some embodiments, the substrate 110 and the semiconductor layer 130 are made of group-IV semiconductor materials. In some embodiments, the substrate 110 and the semiconductor layer 130 are made of different group semiconductor materials, such as a group-IV semiconductor and a III-V semiconductor. In some other embodiments, the substrate 110 may include III-V semiconductor (e.g., GaAs), and the semiconductor layer 130 may be made of group-III or group-V semiconductor materials, such as germanium (Ge), silicon germanium (SiGe), GaAs, InGaAs, InAs, GaN, InP, GaSb, or the like.

After the formation of the semiconductor layer 130, a capping layer 140 is formed over the semiconductor layer 130. The capping layer 140 may be made of suitable nitride materials, such as $Si_3N_4$, and/or suitable oxide materials, such as $SiO_2$. The capping layer 140 may be formed by chemical vapor deposition (CVD), sputtering, furnace, or the like.

Figure 4A:
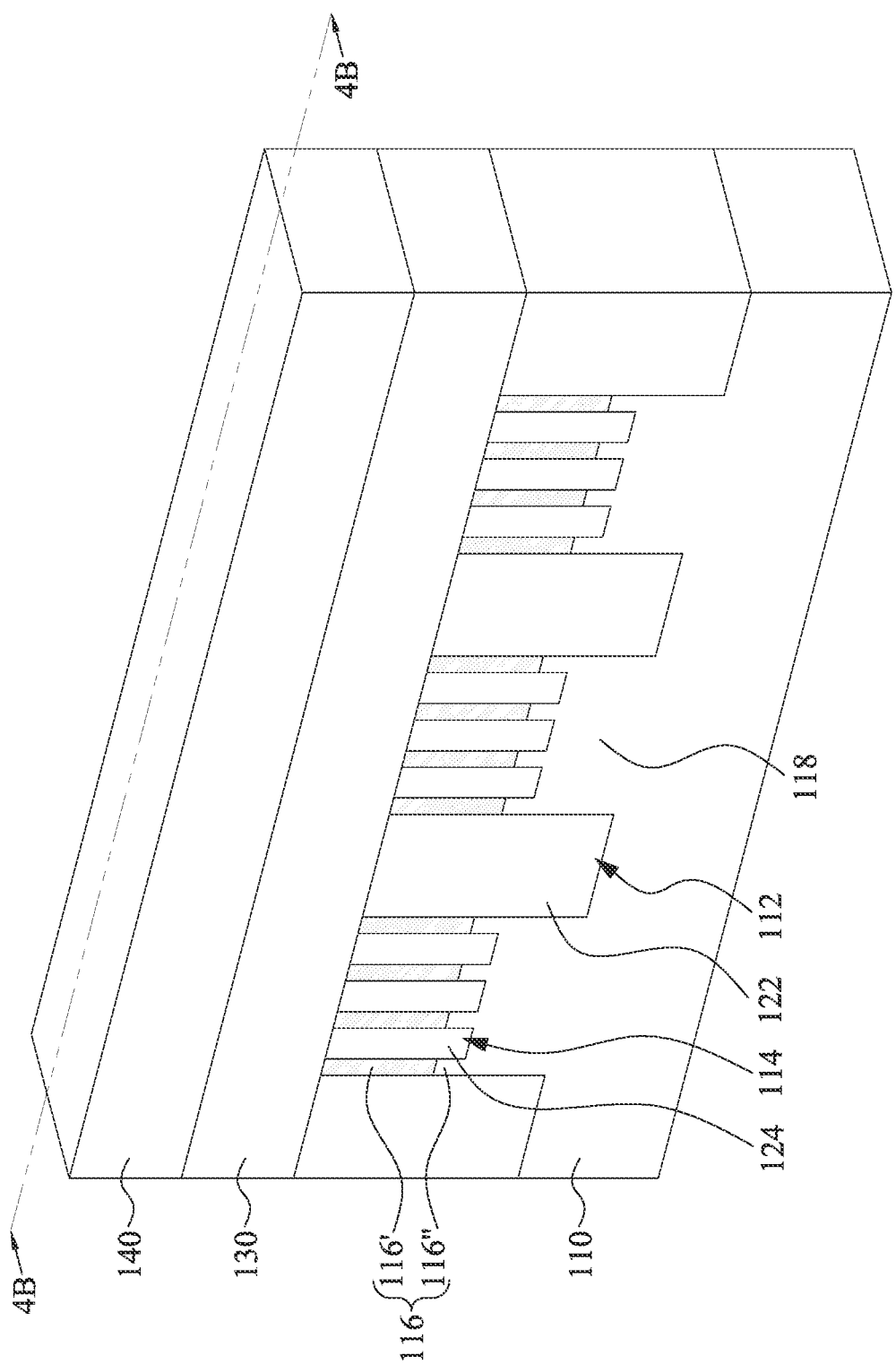
Figure 4B:
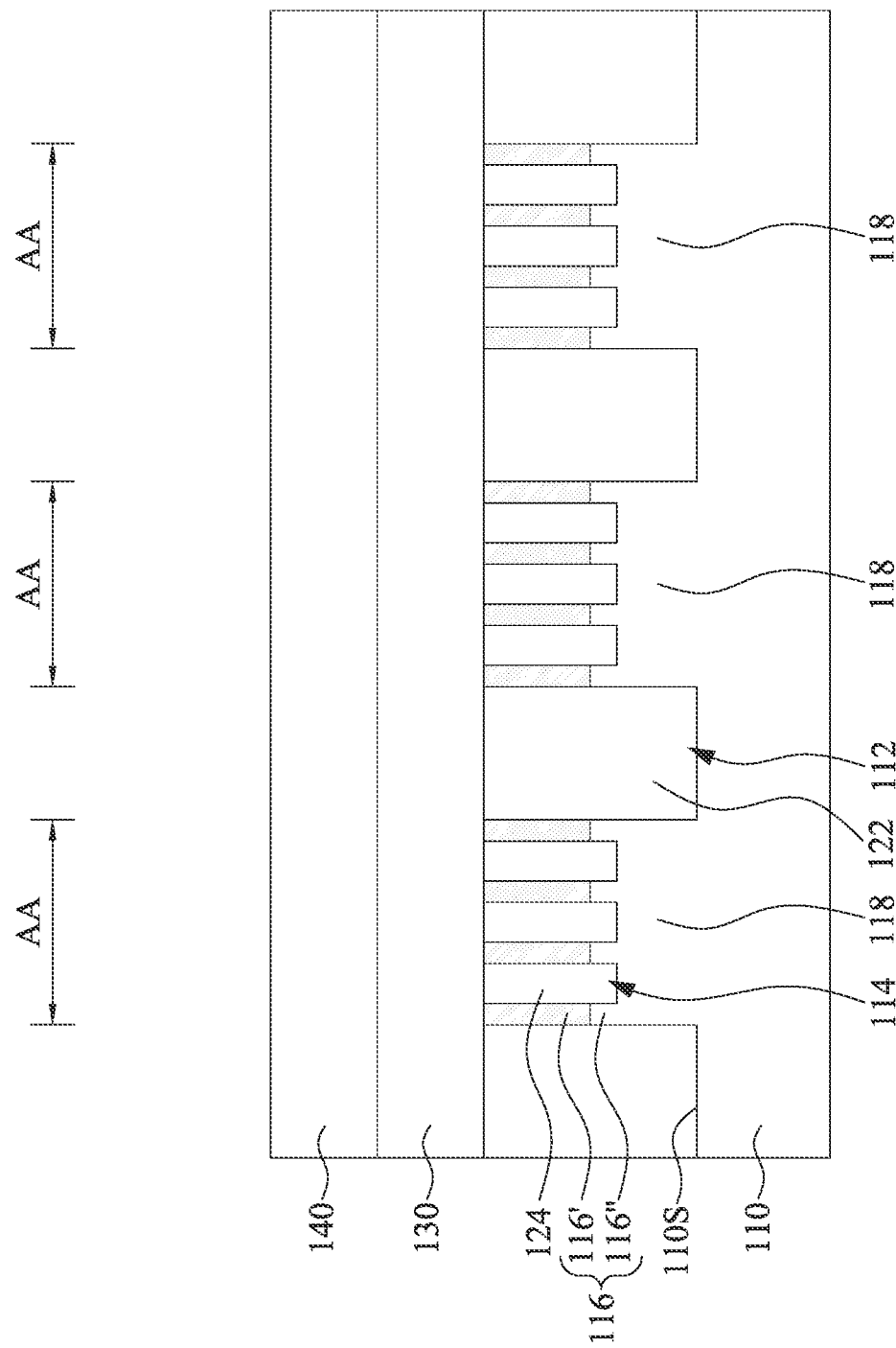

Reference is made to FIGS. 4A and 4B. FIG. 4B is a cross-sectional view taken along line 4B-4B of FIG. 4A. A thermal treatment is performed to the structure to diffuse the germanium atoms from the semiconductor layer 130 into the semiconductor fins 116, such that at least one portion of the semiconductor fins 116 adjacent to the semiconductor layer 130 turns to contain germanium atoms. For example, the thermal treatment includes heating the structure to a temperature greater than a melting point of the semiconductor layer 130 but smaller than a melting point of the material of the substrate 110 and a melting point of the capping layer 140, such that the semiconductor layer 130 melts. The germanium atoms in the melted semiconductor layer 130 moves with large kinetic energy and may diffuse into the semiconductor fins 116. As such, a portion of the semiconductor fins 116 turn into a diffused portion 116' containing germanium atoms after the thermal treatment. A thickness of the diffused portion 116' may be in a range from about 10 nm to about 1 um. For example, the temperature of the thermal treatment is in a range from about 938.2° C. (i.e., germanium melting point) to about 1414° C. (i.e., silicon melting point). During the thermal treatment, the semiconductor layer 130 is in liquid/molten state while the capping layer 140 remains a solid state and the substrate 110 remains in solid single crystalline state. In exemplary embodiments, the thermal treatment may be done by rapid thermal annealing (RTA). In another exemplary embodiments, laser annealing may be used.

In some examples, the germanium atom concentration of the diffused portion 116' may decrease from the semiconductor layer 130 toward a bottom surface of the substrate 110. For example, the diffused portion 116' contains $Si_{1-x}Ge_x$, in which x is in a range of 0 to 1, and x decreases from the semiconductor layer 130 toward the substrate 110. For example, x decreases from 0.6 to 0.5 from the semiconductor layer 130 toward a bottom surface of the substrate 110. In some embodiments, little germanium atoms diffuse to a remaining portion 116'' of the semiconductor fins 116 at a position lower than the diffused portion 116', such that the remaining portion 116'' of the semiconductor fins 116 may not contain germanium atoms. For example, the diffused portion 116' contains SiGe, while the remaining portion 116'' contain Si. In some other embodiments, the semiconductor fins 116 in FIGS. 3A and 3B may be entirely diffused and turned into the diffused portion 116', rather than remaining the portion 116'' shown in FIGS. 4A and 4B. After the thermal treatment, a cooling treatment may be optionally performed to solidify the semiconductor layer 130.

Figure 5A:
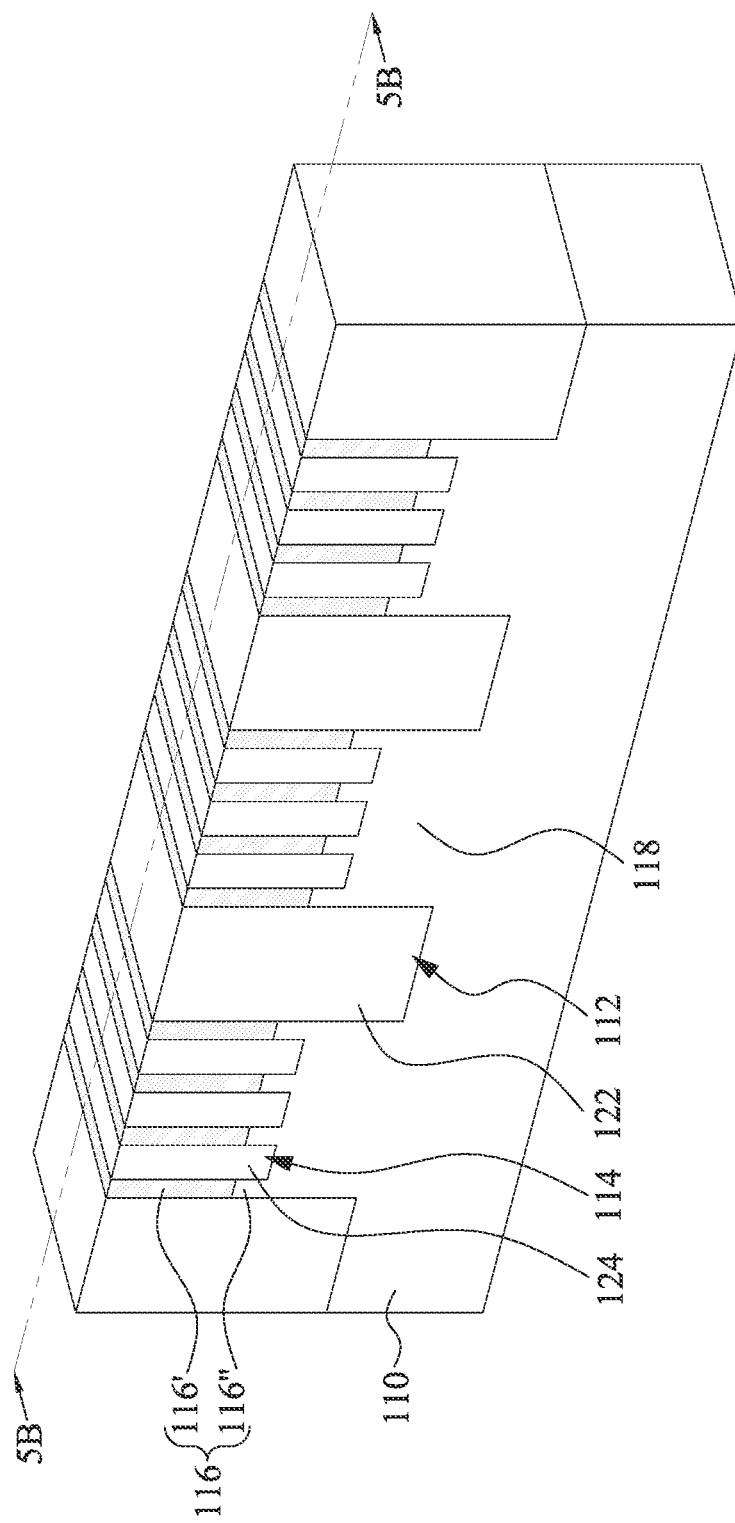
Figure 5B:
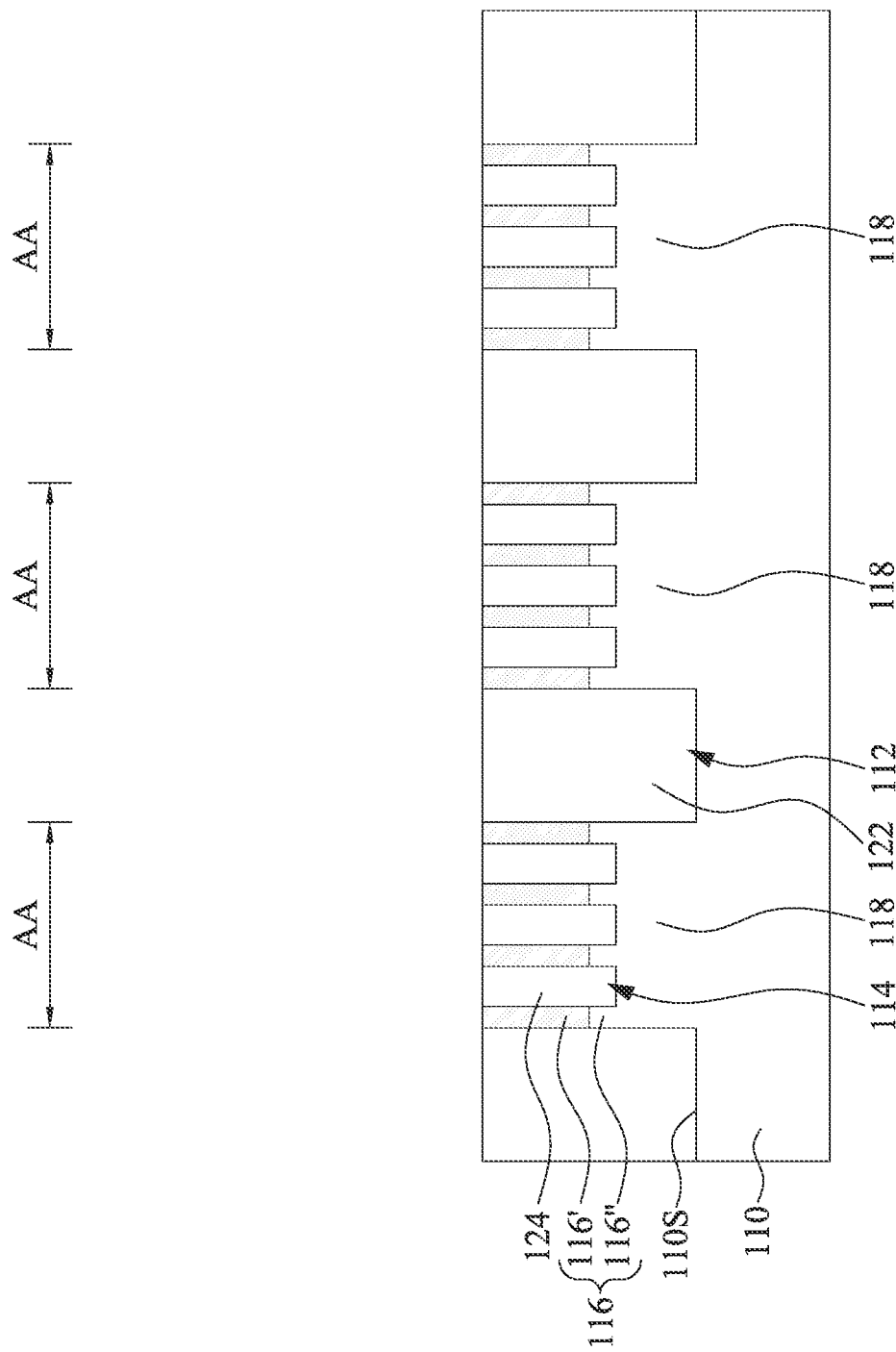

Reference is made to FIGS. 5A and 5B. FIG. 5B is a cross-sectional view taken along line 5B-5B of FIG. 5A. The semiconductor layer 130 and the capping layer 140 are removed from the diffused portion 116'. The removal of the semiconductor layer 130 and the capping layer 140 may include etch processes and a chemical planarization process. For example, one of the etch processes is performed to remove the capping layer 140 using etchants, such as fluorine-based etching gas and chlorine-based etching gas. The fluorine-based etching gas may include hydrogen fluoride (HF) and buffered oxide etch (BOE), which is the mixture of HF and $NH_4F$). Subsequently, another one of the etch process is performed to remove the semiconductor layer 130 using etchants, such as $NH_3OH/H_2O_2/H_2O$, $HCl/H_2O_2/H_2O$, and chlorine-based etching gas. Afterwards, the chemical planarization process is performed to planarize the top surface of the diffused portion 116' and the isolation structures 122 and 124.

Figure 6A:
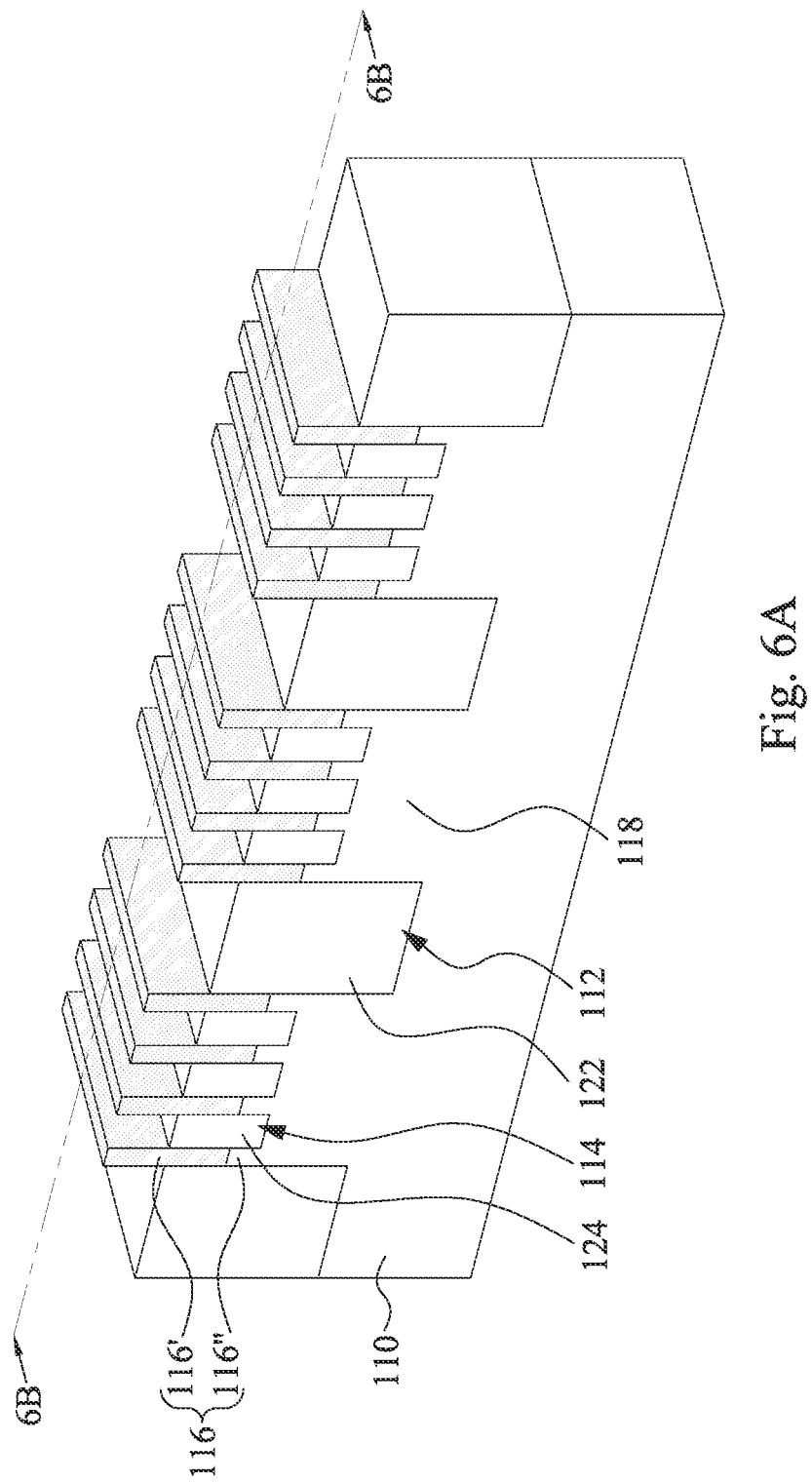
Figure 6B:
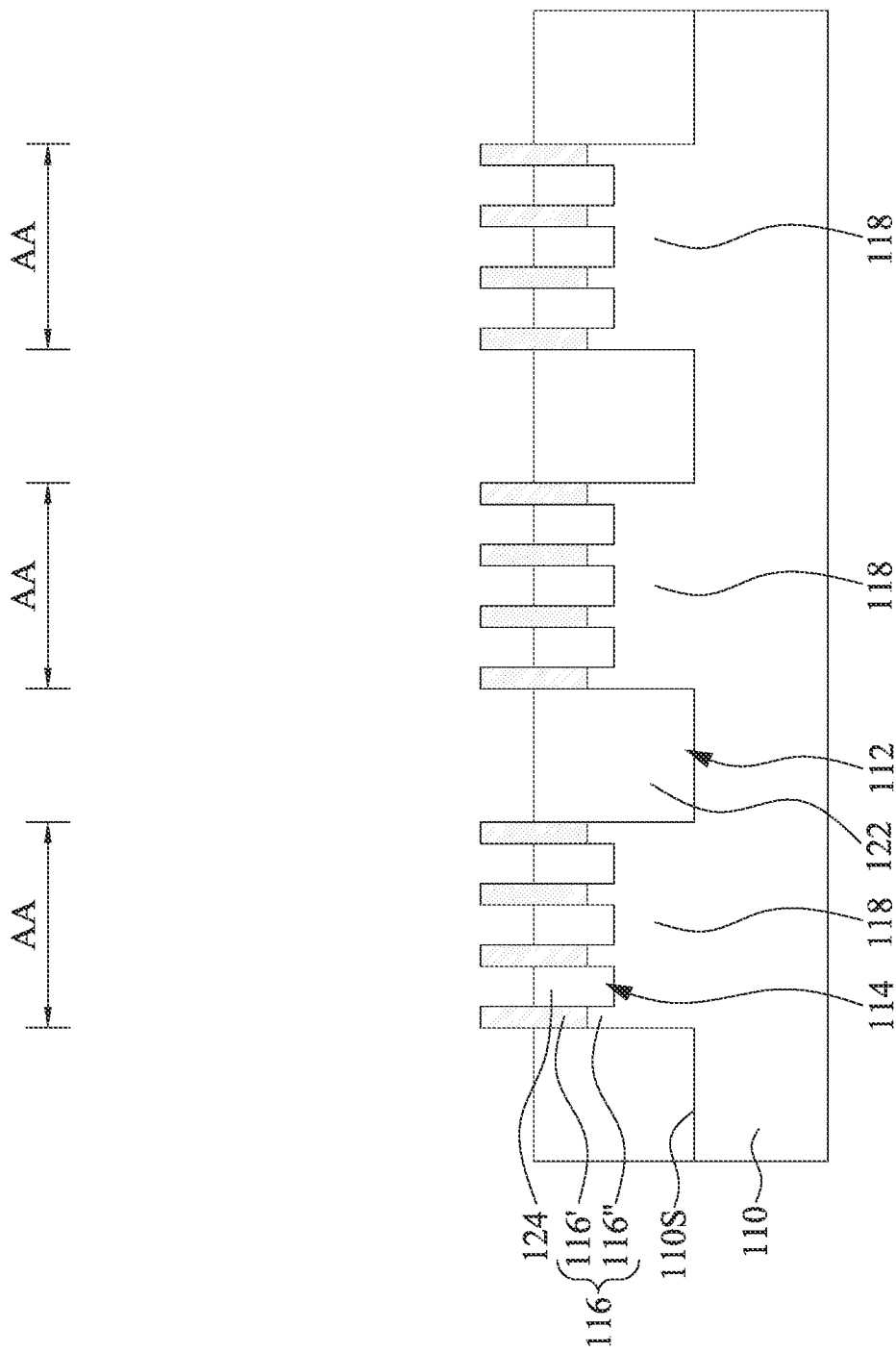

Reference is made to FIGS. 6A and 6B. FIG. 6B is a cross-sectional view taken along line 6B-6B of FIG. 6A. The isolation structures 122 and 124 are recessed by suitable etch back process, such that the diffused portion 116' of the semiconductor fins 116 protrude above the isolation structures 122 and 124. The recessing may be performed to expose at least a portion of the sidewalls of the diffused portion 116' of the semiconductor fin 116. The isolation structures 122 and 124 may be recessed using a wet etch by dipping the top surface of the substrate 110 into an etchant such as HF, although other etchants, such as $H_2$, and other methods, such as a reactive ion etch, a dry etch with etchants such as $NH_3/NF_3$, chemical oxide removal, or dry chemical clean may alternatively be used. In the present embodiments, a top surface of the isolation structures 122 and 124 is higher than the remaining portion 116'' of the semiconductor fins 116, such that the remaining portion 116'' is not exposed. In some other embodiments, the portions 116' and 116'' of the semiconductor fins 116 protrude above the isolation structures 122 and 124.

Figure 7A:
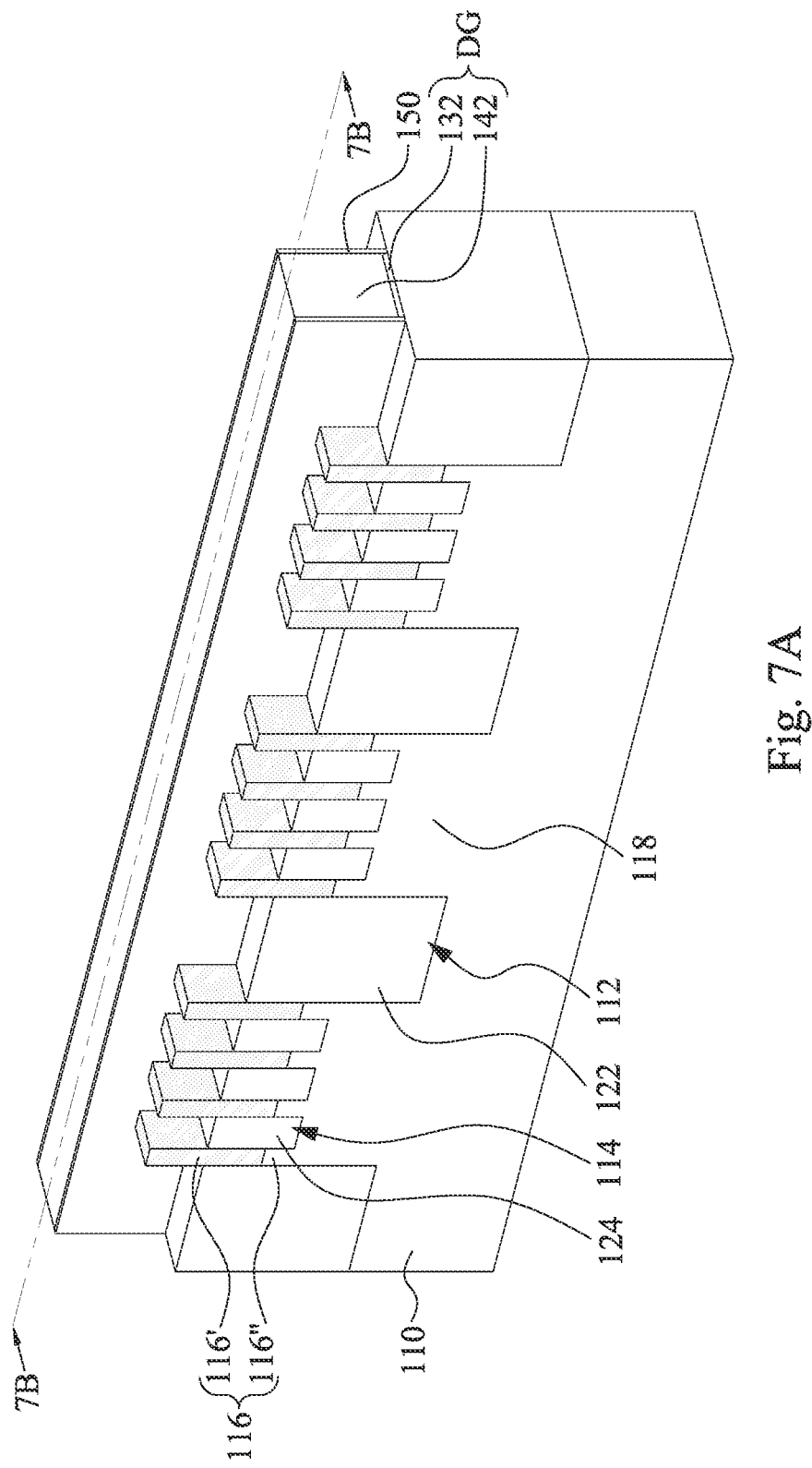
Figure 7B:
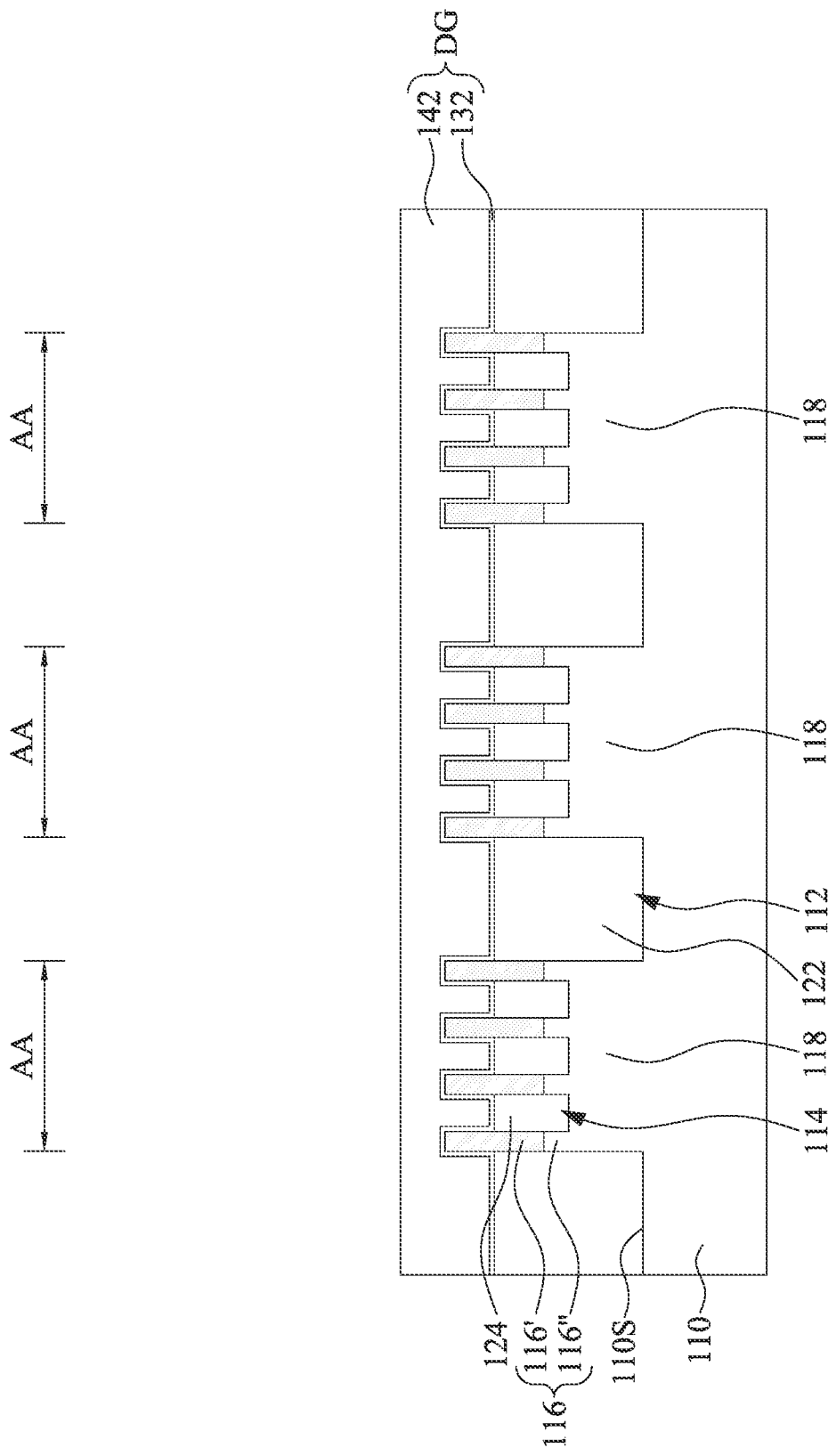

Reference is made to FIGS. 7A and 7B. FIG. 7B is a cross-sectional view taken along line 7B-7B of FIG. 7A. At least one dummy gate structure DG is formed around the diffused portion 116' of the semiconductor fins 116. In some embodiments, the dummy gate structure DG includes a dummy gate 142 and a gate dielectric 132 underlying the dummy gate 142. The dummy gate 142 may include polycrystalline-silicon (poly-Si) or poly-crystalline silicon-germanium (poly-SiGe). Further, the dummy gate 141 may be doped poly-silicon with uniform or non-uniform doping. The gate dielectric 132 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof.

In some embodiments, the dummy gate structure DG may be formed by, for example, forming a stack of a gate dielectric layer and a dummy gate material layer over the substrate 110. A patterned mask is formed over the stack of gate dielectric layer and dummy gate material layer. Then, the gate dielectric layer and the dummy gate material layer may be patterned using one or more etching processes, such as one or more dry plasma etching processes or one or more wet etching processes. During the etching process, the patterned mask may act as an etching mask. At least one parameter, such as etchant, etching temperature, etching solution concentration, etching pressure, source power, radio frequency (RF) bias voltage, etchant flow rate, of the patterning (or etching) recipe can be tuned. For example, dry etching process, such as plasma etching, may be used to etch the dummy gate material layer and the gate dielectric layer until the diffused portions 116' of the semiconductor fins 116 are exposed.

In some embodiments, gate spacers 150 are formed on opposite sidewalls of the dummy gate structure DG. In some embodiments, the gate spacers 150 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The gate spacers 150 may include a single layer or multilayer structure made of different dielectric materials. The method of forming the gate spacers 150 includes blanket forming a dielectric layer using, for example, CVD, PVD or ALD, and then performing an etching process such as anisotropic etching to remove horizontal portions of the dielectric layer. The remaining portions of the dielectric layer on sidewalls of the dummy gate structure DG can serve as the gate spacers 150. In some embodiments, the gate spacers 150 may be used to offset subsequently formed doped regions, such as source/drain regions. The gate spacers 150 may further be used for designing or modifying the source/drain region profile.

Figure 8:
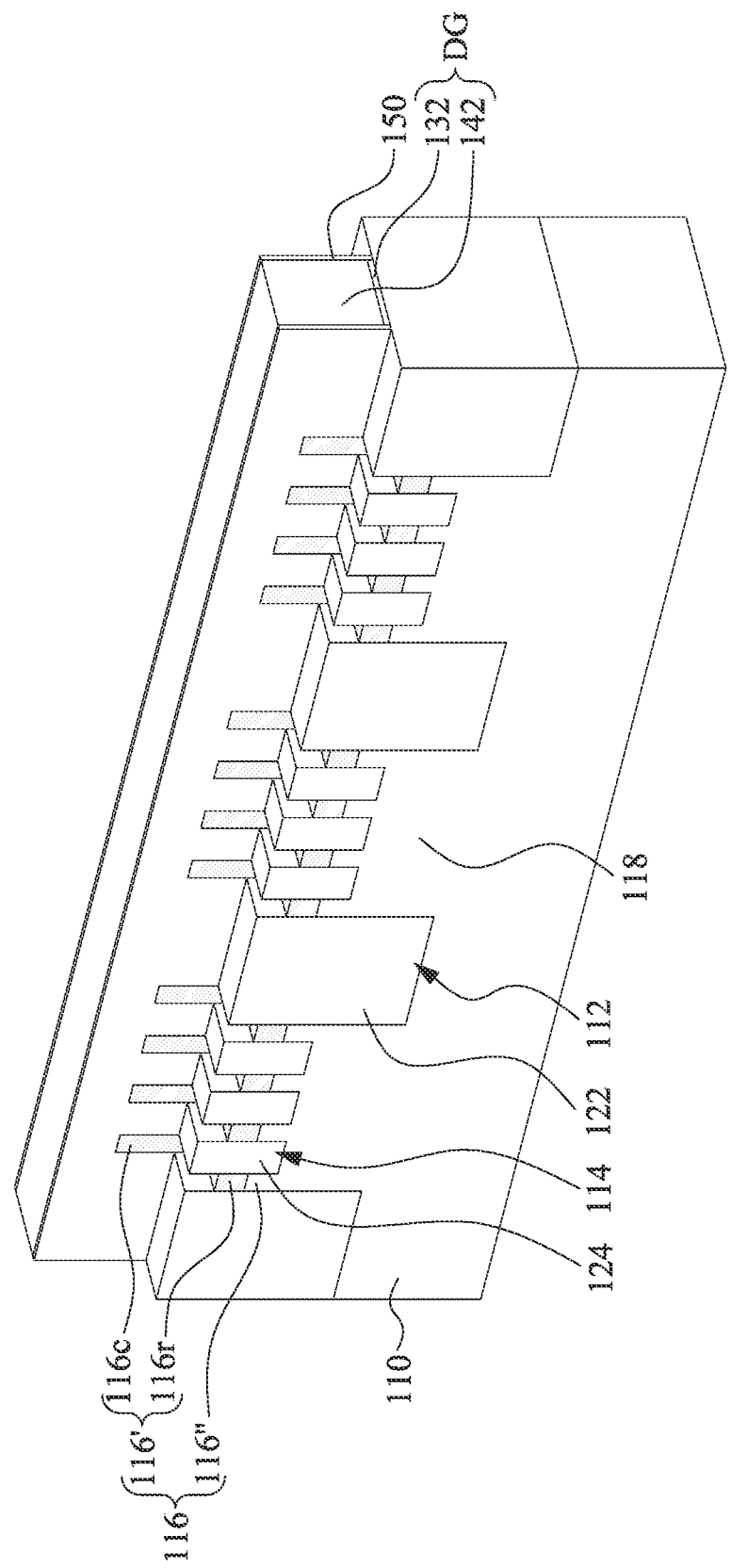

Reference is made to FIG. 8. Portions of the semiconductor fin 116 uncovered by the dummy gate structure DG are removed, such that each of the remaining semiconductor fins include a recessed portion 116r uncovered by the dummy gate structure DG and a channel portion 116c covered by the dummy gate structure DG, respectively. Herein, the diffused portions 116' uncovered by the dummy gate structure DG are partially removed, and the remaining diffused portions 116' includes a recessed portion 116r and a channel portion 116c. In some other embodiments, both the diffused portions 116' and the portions 116" uncovered by the dummy gate structure DG are partially removed, the remaining diffused portions 116' forms the channel portion covered by the dummy gate structure DG, and the remaining portions 116" forms the recessed portion uncovered by the dummy gate structure DG.

The removal of the semiconductor fin 116 may include a dry etching process, a wet etching process, or combination of dry and wet etching processes. The recessing process may also include a selective wet etch or a selective dry etch. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching). After the etching process, a pre-cleaning process may be performed to clean the recesses with hydrofluoric acid (HF) or other suitable solution in some embodiments.

Figure 9:
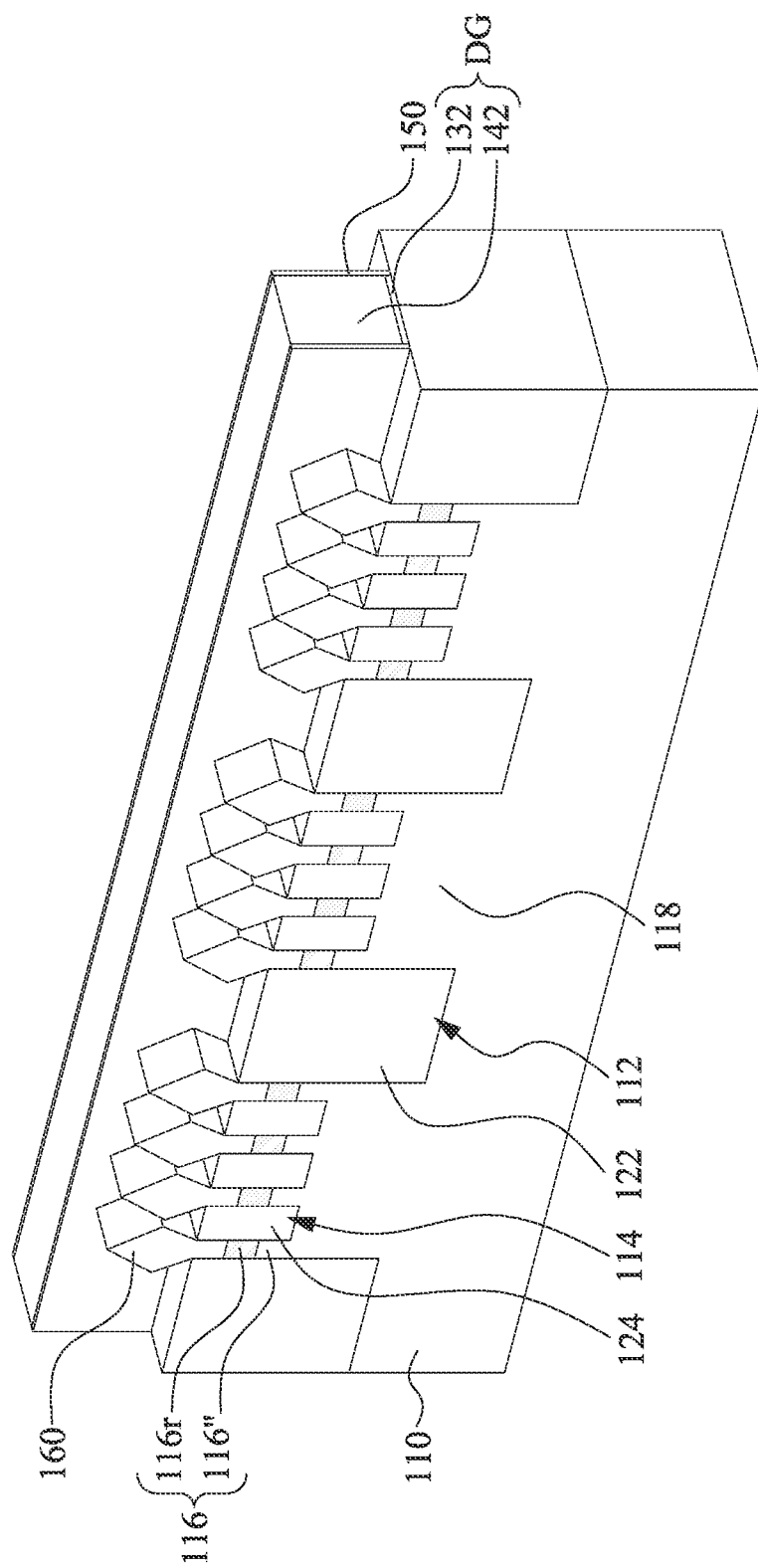

Reference is made to FIG. 9. A plurality of source/drain features 160 are respectively formed on the recessed portions 116r of the semiconductor fins 116. In some embodiments, the source/drain features 160 may be epitaxy structures, and may also be referred to as epitaxy features 160. The source/drain features 160 may be formed using one or more epitaxy or epitaxial (epi) processes, such that Si features, SiGe features, and/or other suitable features can be formed in a crystalline state on the semiconductor fins 116. In some embodiments, lattice constants of the source/drain features 160 are different from lattice constants of the semiconductor fins 116, such that channels in the channel portions 116c of the semiconductor fins 116 (referring to FIG. 8) are strained or stressed to enable carrier mobility of the semiconductor device and enhance the device performance. In some embodiments, the source/drain features 160 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 116 (e.g., silicon). The source/drain features 160 may be in-situ doped. The doping species include P-type dopants, such as boron or $BF_2$; N-type dopants, such as phosphorus or arsenic; and/or other suitable dopants including combinations thereof. The source/drain features 160 abutting the dummy gate structure DG may be doped with dopants of the same or different conductive types. If the source/drain features 160 are not in-situ doped, a second implantation process (i.e., a junction implant process) is performed to dope the source/drain features 160. One or more annealing processes may be performed to activate the source/drain features 160. The annealing processes include rapid thermal annealing (RTA) and/or laser annealing processes.

Figure 10:
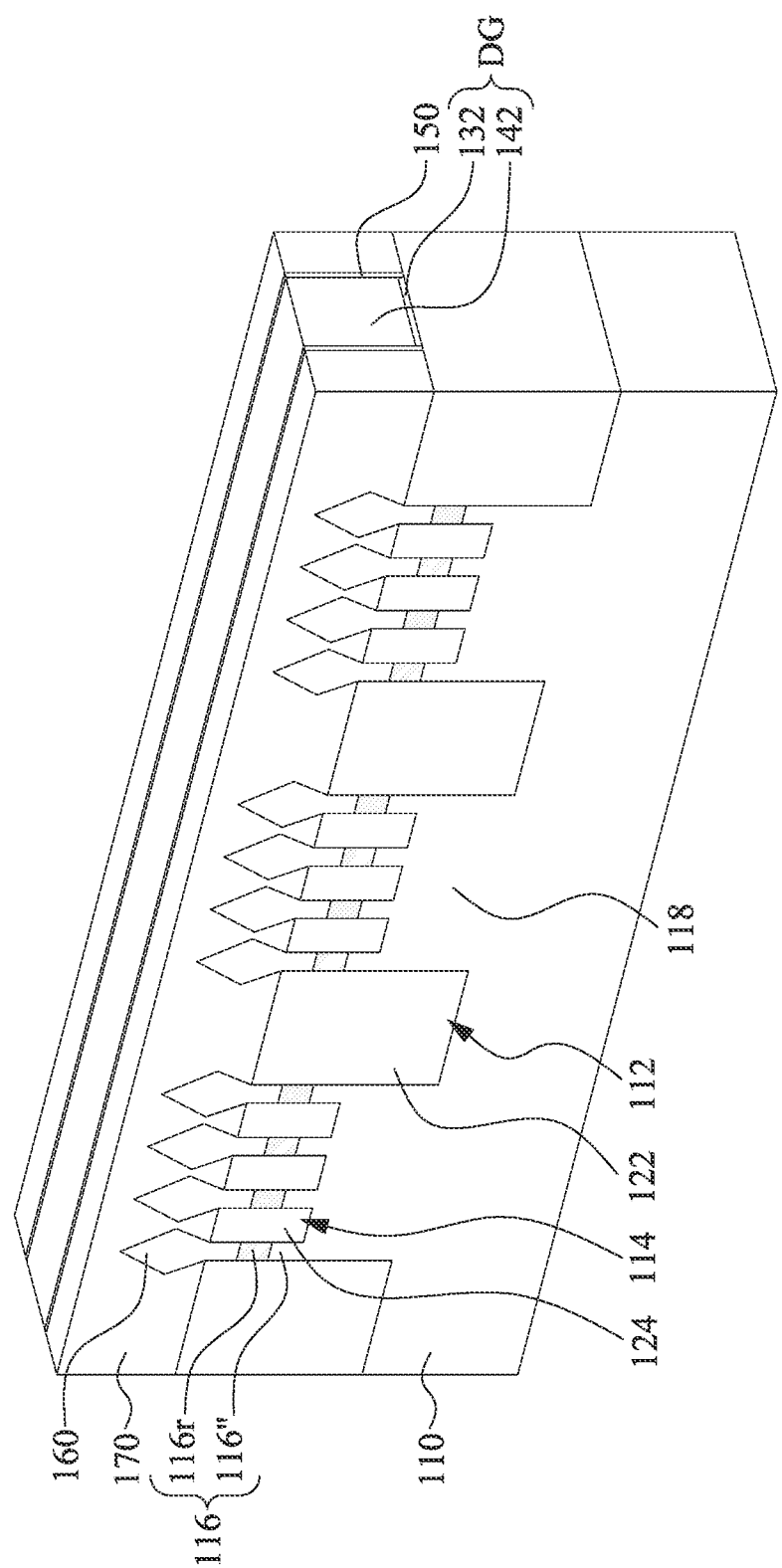

Reference is made to FIG. 10. After the source/drain features 160 are formed, an interlayer dielectric (ILD) 170 is formed over the substrate 110 and surrounding the source/drain features 160. The ILD 170 may include silicon oxide, oxynitride or other suitable materials. The ILD 170 includes a single layer or multiple layers. The ILD 170 can be formed by a suitable technique, such as CVD or ALD. A chemical mechanical polishing (CMP) process may be performed to remove an excess portion of the ILD 170 until reaching the dummy gate structure DG. After the chemical mechanical planarization (CMP) process, the dummy gate structure DG is exposed from the ILD 170. In some embodiments, a contact etch stop layer (CESL) may be blanket formed over the substrate 110 prior to the formation of the ILD 170.

Figure 11A:
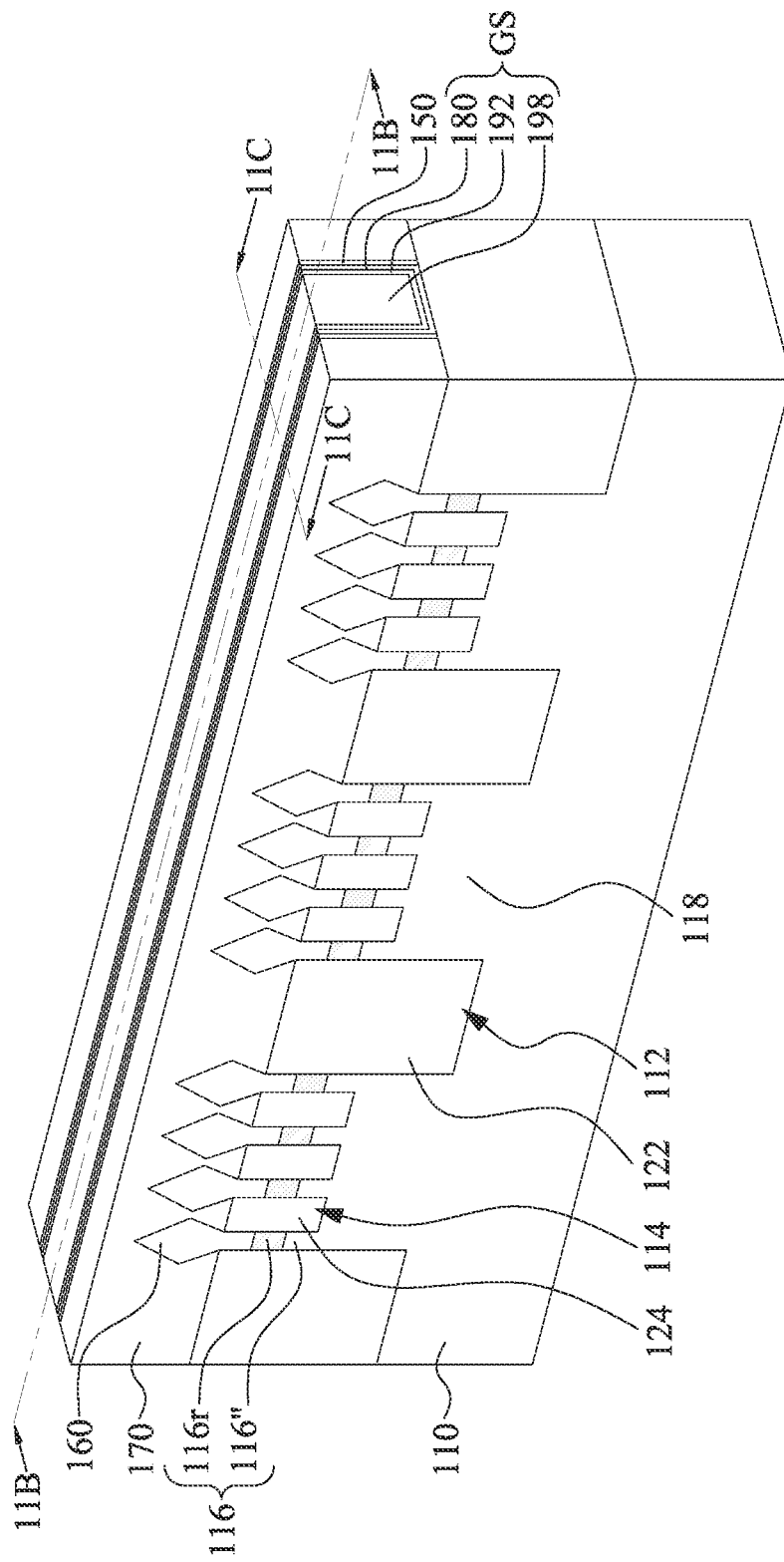
Figure 11B:
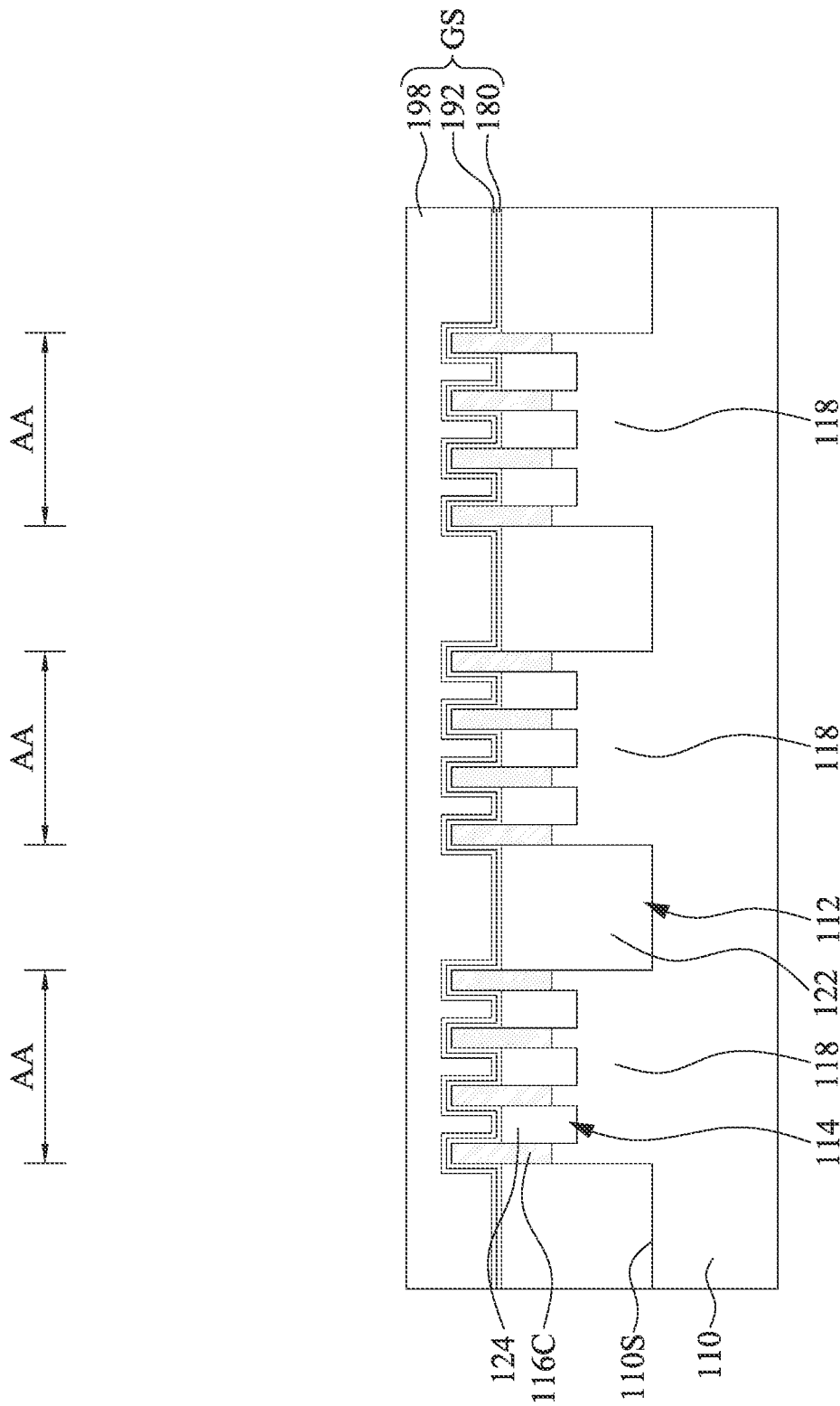
Figure 11C:
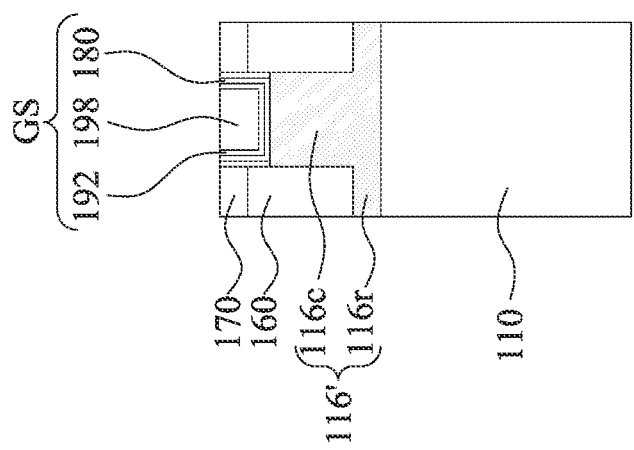

Reference is made to FIGS. 11A-11C. FIG. 11B is a cross-sectional view taken along line 11B-11B of FIG. 11A. FIG. 11C is a cross-sectional view taken along line 11C-11C of FIG. 11A. The dummy gate structure DG (referring to FIG. 10) is replaced with a gate structure GS. To be specific, the dummy gate structure DG (referring to FIG. 10) is removed, and a gate trench is left with the gate spacers 150 as their sidewalls. In some embodiments, the dummy gate structure DG (referring to FIG. 10) is removed by performing a first etching process and performing a second etching process after the first etching process. In some embodiments, the dummy gate 142 (referring to FIG. 10) is mainly removed by the first etching process, and the gate dielectric 132 (referring to FIG. 10) is mainly removed by the second etching process. In some embodiments, the first etching process is a dry etching process and the second etching process is a wet etching process. In some embodiments, the dry etching process includes using an etching gas such as $CF_4$, Ar, $NF_3$, $Cl_2$, He, HBr, $O_2$, $N_2$, $CH_3F$, $CH_4$, $CH_2F_2$, or combinations thereof. In some other embodiments, the dummy gate 142 (referring to FIG. 10) is removed, while the gate dielectric 132 (referring to FIG. 10) remains in the gate trenches.

The gate trench exposes channel portions 116c of the diffused portion 116' (referring to FIG. 8). A gate dielectric layer 180 is conformally formed in the gate trench, a work function metal layer 192 is conformally formed over the gate dielectric layer 180 in the gate trench, and a filling conductor 198 fills a recess in the work function metal layer 192. In some embodiments, a combination of the gate dielectric layer 180, the work function metal layer 192, and the filling conductor 198 may be referred to as a gate structure GS.

The gate dielectric layer 180, as used and described herein, include dielectric materials having a high dielectric constant, for example, greater than that of thermal silicon oxide (~3.9). The gate dielectric layer 180 may include a high-K dielectric layer such as tantalum, hafnium, titanium, lanthanum, aluminum and their carbide, silicide, nitride, boride combinations. The gate dielectric layer 180 may include other high-K dielectrics, such as $HfO_2$, $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric layer 180 may be formed by ALD, PVD, CVD, oxidation, and/or other suitable methods.

The work function metal layer 192 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function metal layer 192 may include a plurality of layers. The work function metal layer 192 may be deposited by CVD, PVD, electro-plating and/or other suitable process.

The filling conductor 198 may include metal or metal alloy. For example, the filling conductor 198 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. In some embodiments, a chemical mechanical polishing process may be optionally performed, so as to level the top surfaces of the work function metal layer 192 and the filling conductor 198. The filling conductor 198 may be referred to as gate conductor in this context.

Figure 12:
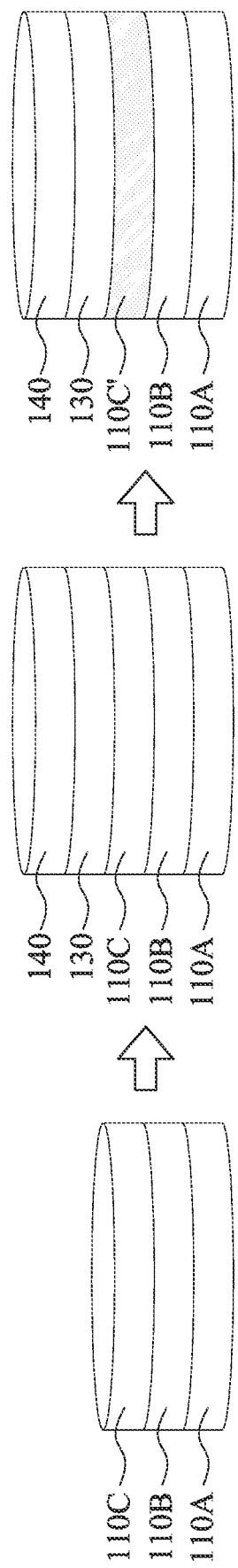
FIG. 12 illustrate cross-sectional views of a wafer at various stages in accordance with some embodiments.

FIG. 12 illustrate cross-sectional views of a wafer at various stages in accordance with some embodiments. A substrate 110 is provided as a SOI substrate. The SOI substrate 110 includes a support substrate 110A, a semiconductor layer 110C, and an insulator layer 110B interposed between the support substrate 110A and the semiconductor layer 110C. The support substrate 110A and the semiconductor layer 110C may include silicon, gallium arsenide, gallium nitride, strained silicon, silicon germanium, silicon carbide, carbide, diamond, an epitaxy layer, and/or other materials in a crystalline state. The insulator layer 110B may include silicon oxide, silicon nitride, silicon oxynitride, and/or other dielectric materials. In some embodiments, the insulator layer 110B may be a dielectric layer or a stack of plural dielectric layers. The support substrate 110A and the semiconductor layer 110C may be formed using various SOI technologies. For example, the support substrate 110A may be formed on a semiconductor wafer by a process referred to as separation by implanted oxygen (SIMOX). The SIMOX technology is based on ion-implanting a high-dose of oxygen ions into a silicon wafer, such that the peak concentration lies beneath the silicon surface. After implantation the wafer is subjected to a high-temperature anneal (about 1150° C. to about 1400° C., for example) to form a continuous stoichiometric subsurface layer of silicon dioxide. Thus formed insulator layer 110B, also referred to as buried oxide or BOX electrically separates the semiconductor layer 110C and the support substrate 110A.

A semiconductor layer 130 (e.g., a Ge layer) containing germanium atoms is formed over the SOI substrate 110 in an amorphous state. For example, a sputtering deposition process is performed to form the semiconductor layer 130. After the formation of the semiconductor layer 130, a capping layer 140 is formed over the semiconductor layer 130. The capping layer 140 may be made of oxide materials, such as $SiO_2$.

Figure 13:
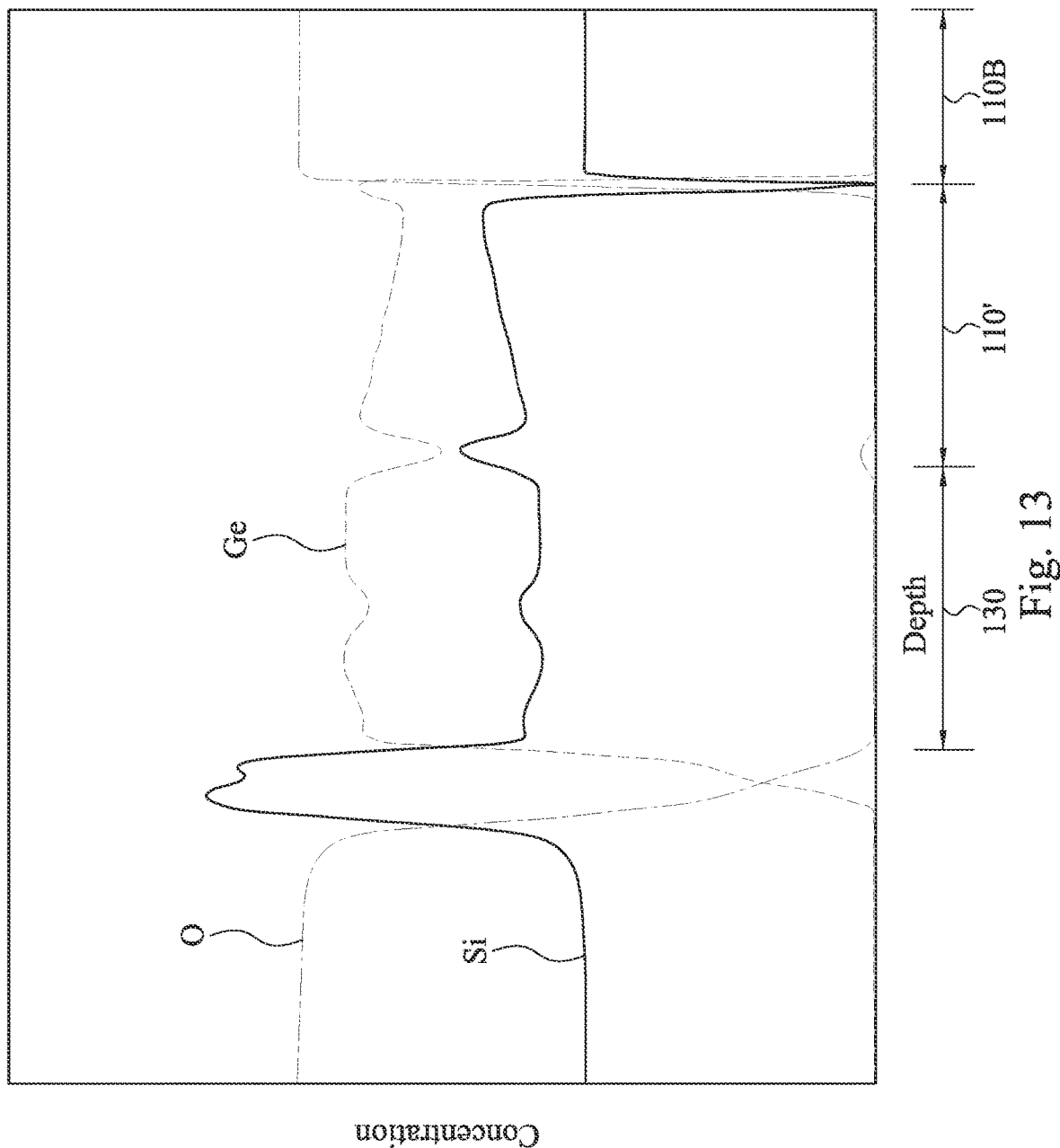
FIG. 13 is a diagram shows atom concentrations of a processed substrate by Secondary Ion Mass Spectroscopy (SIMS) measurement.

A thermal treatment is performed to the SOI substrate 110, to diffuse the germanium atoms from the semiconductor layer 130 into the semiconductor layer 110C, such that at least one portion of the semiconductor layer 110C adjacent to the semiconductor layer 130 turns to contain germanium atoms. For example, the semiconductor layer 110C is turned into a semiconductor layer 110C' containing germanium atoms after the thermal treatment. FIG. 13 is a diagram shows atom concentrations of the processed substrate by Secondary Ion Mass Spectroscopy (SIMS) measurement. As shown in FIG. 13, the germanium atom concentration of the semiconductor layer 110C' may decrease from the semiconductor layer 130 toward the insulator layer 110B.

Figure 14A:
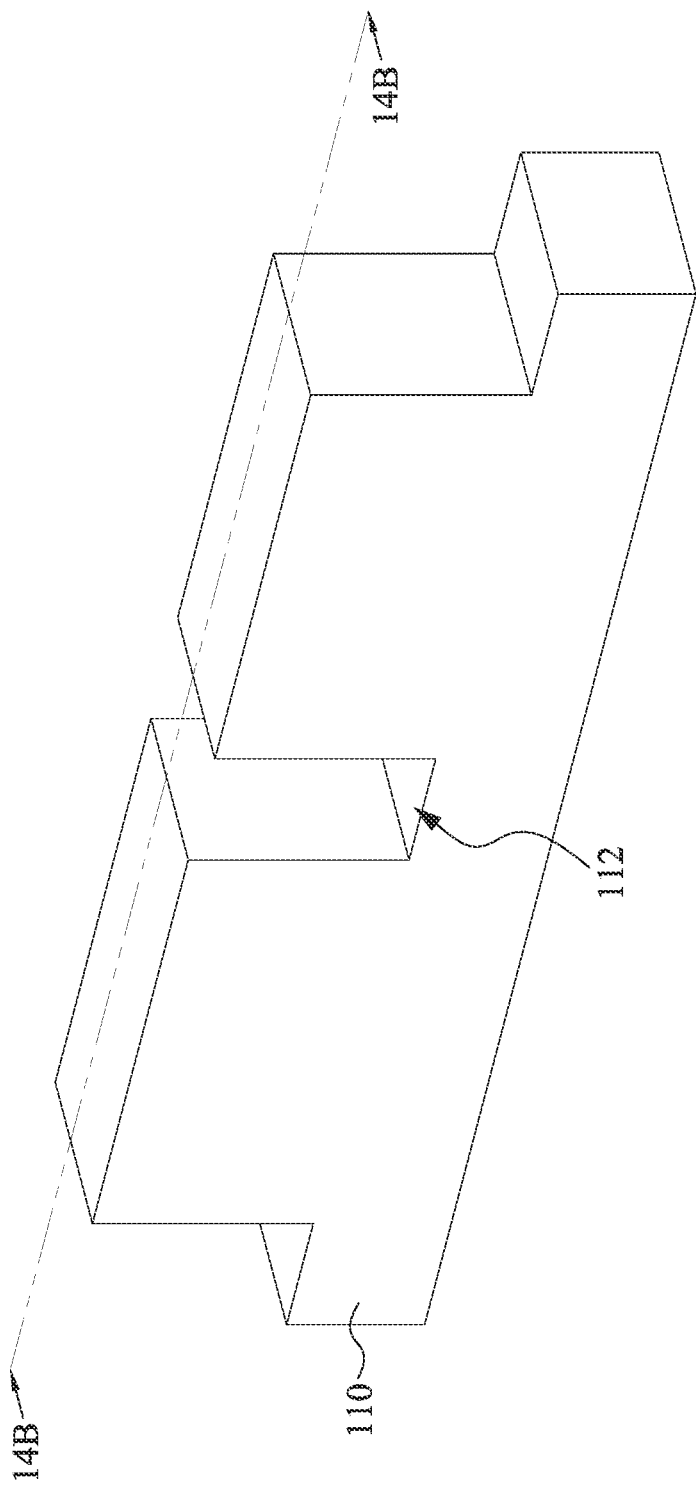
FIGS. 14A-26C illustrate a method of manufacturing a semiconductor device at various stages in accordance with some embodiments.
Figure 14B:
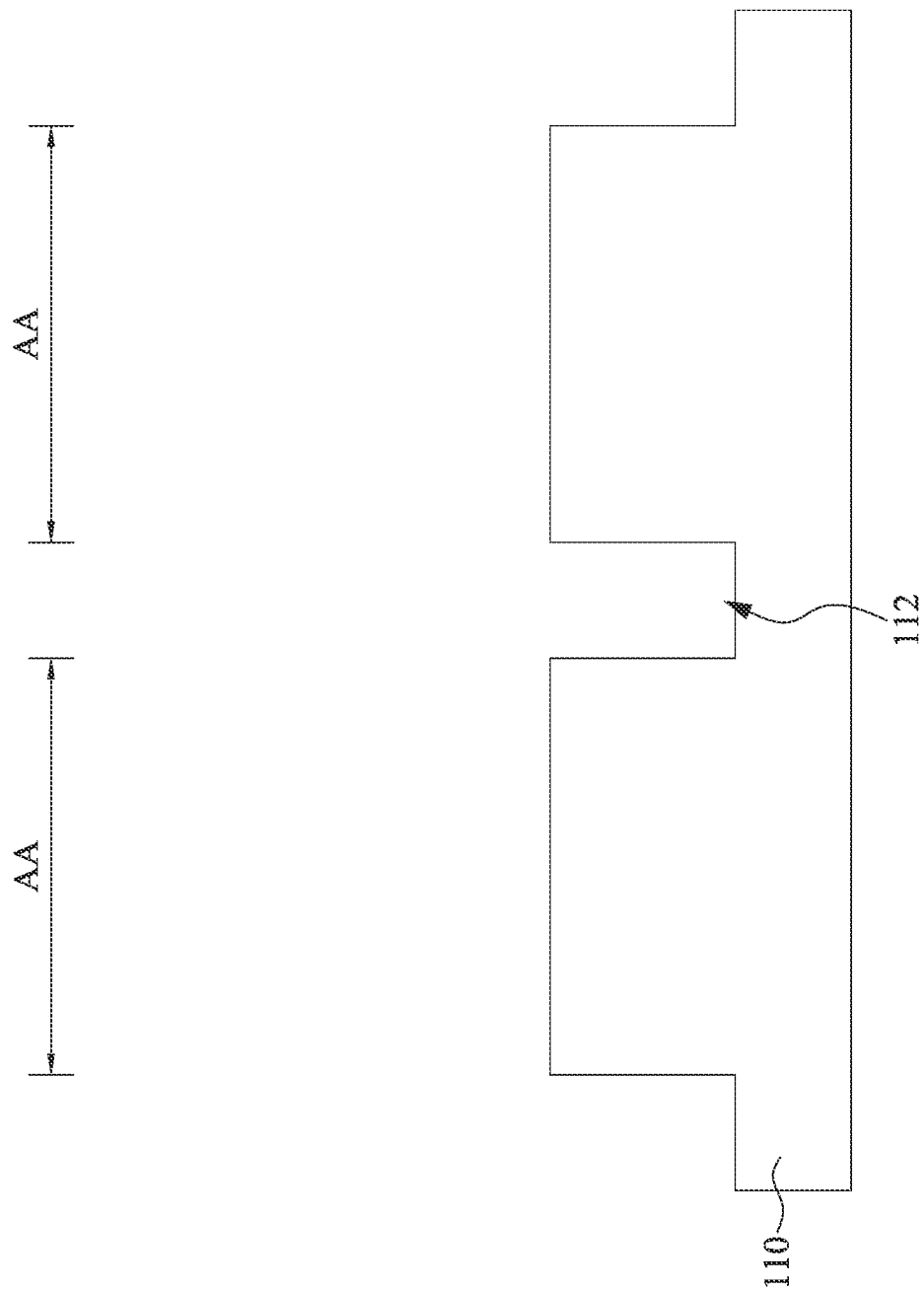

FIGS. 14A-26C illustrate a method of manufacturing a semiconductor device at various stages in accordance with some embodiments. Reference is made to FIGS. 14A and 14B. FIG. 14B is a cross-sectional view taken along line 14B-14B of FIG. 14A. A substrate 110 is provided, and trenches 112 are formed in the substrate 110 for defining areas AA of the substrate 110. The trenches 112 may be formed using a masking layer (not shown) along with a suitable etching process. For example, the masking layer may be a hardmask including silicon nitride formed through a process such as chemical vapor deposition (CVD), although other materials, such as oxides, oxynitrides, silicon carbide, combinations of these, or the like, and other processes, such as plasma enhanced CVD (PECVD), low pressure CVD (LPCVD), or even silicon oxide formation followed by nitridation, may alternatively be utilized. Once formed, the masking layer may be patterned through a suitable photolithographic process to expose those portions of the substrate 110. The exposed portions of the substrate 110 may be removed through a suitable process such as reactive ion etching (RIE) in order to form the trenches 112 in the substrate 110, although other suitable processes may alternatively be used.

Figure 15A:
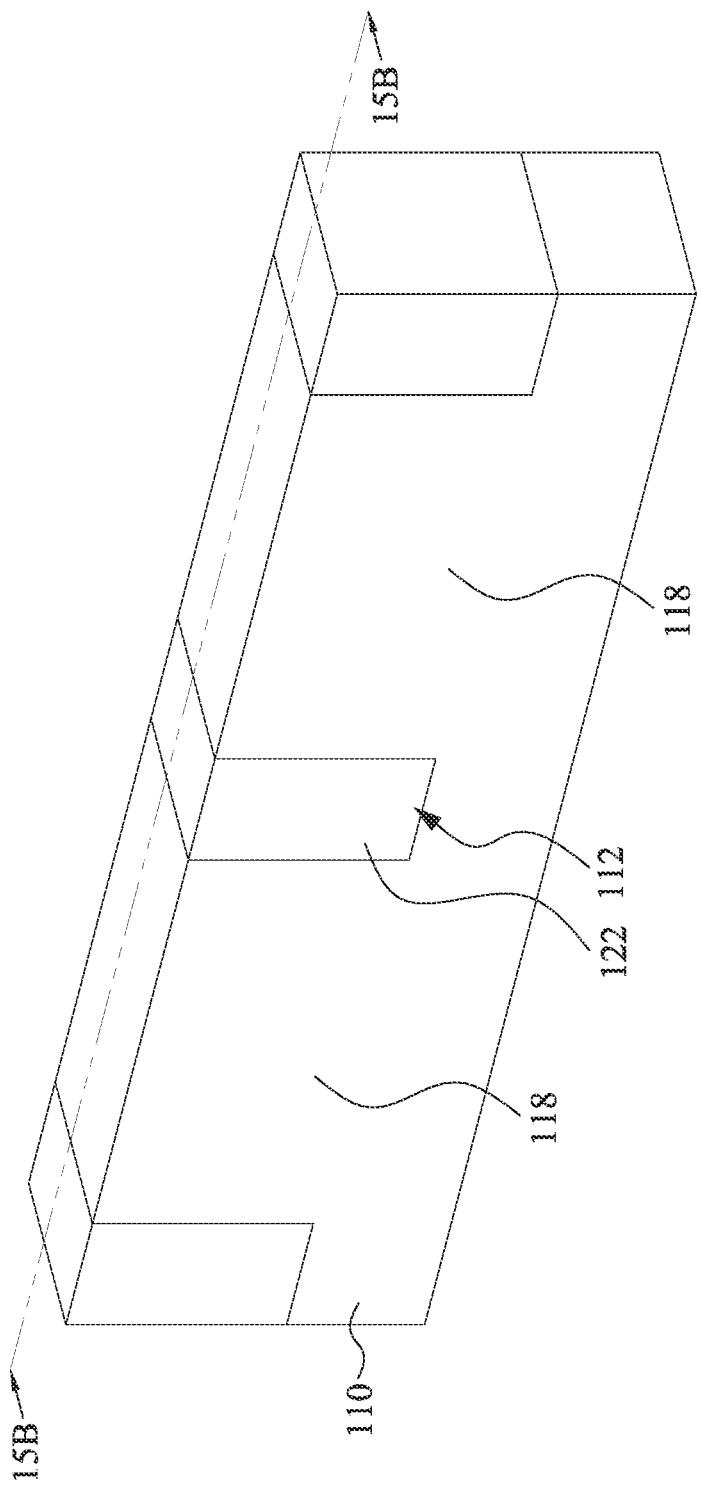
Figure 15B:
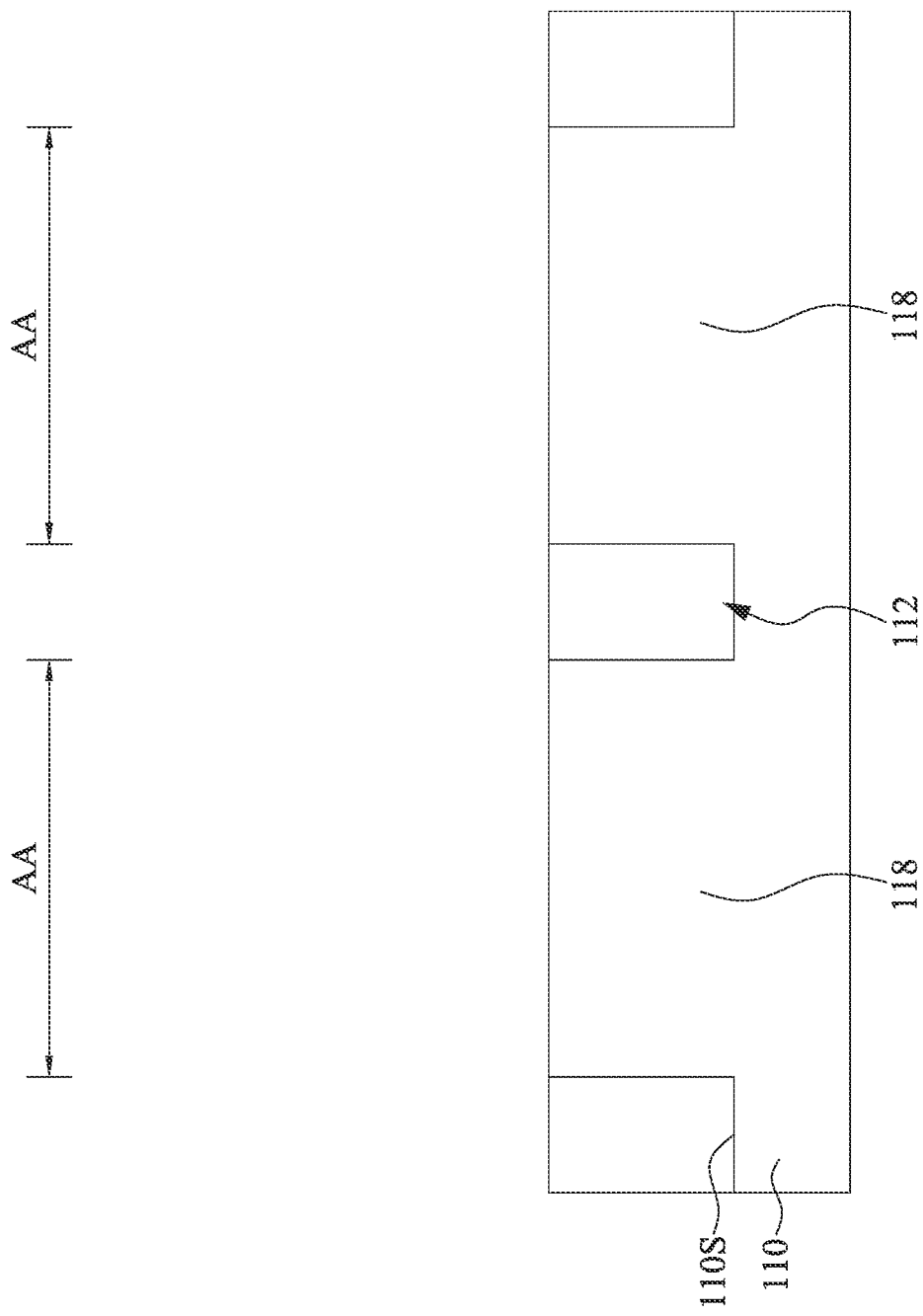

Reference is made to FIGS. 15A and 15B. FIG. 15B is a cross-sectional view taken along line 15B-15B of FIG. 15A. The trenches 112 are overfilled with a dielectric material, and then a planarization process is performed to remove portions of the dielectric material out of the trenches 112, such that a top surface of the substrate 110 is exposed. The dielectric material forms inter-device isolation structures 122 in the trenches 112. The inter-device isolation structures 122 define protruding portions 118 in the areas AA of the substrate 110. The protruding portions 118 protrude outward from a surface 110S of the semiconductor substrate 110 as plateaus. The dielectric material may be an oxide material, a high-density plasma (HDP) oxide, or the like. The dielectric material may be formed, after an optional cleaning and lining of the trenches 112, using a CVD method (e.g., the high aspect ratio process (HARP) process), a high-density plasma CVD method, or other suitable formation method. The planarization process may include a chemical-mechanical polish (CMP) process.

Figure 16B:
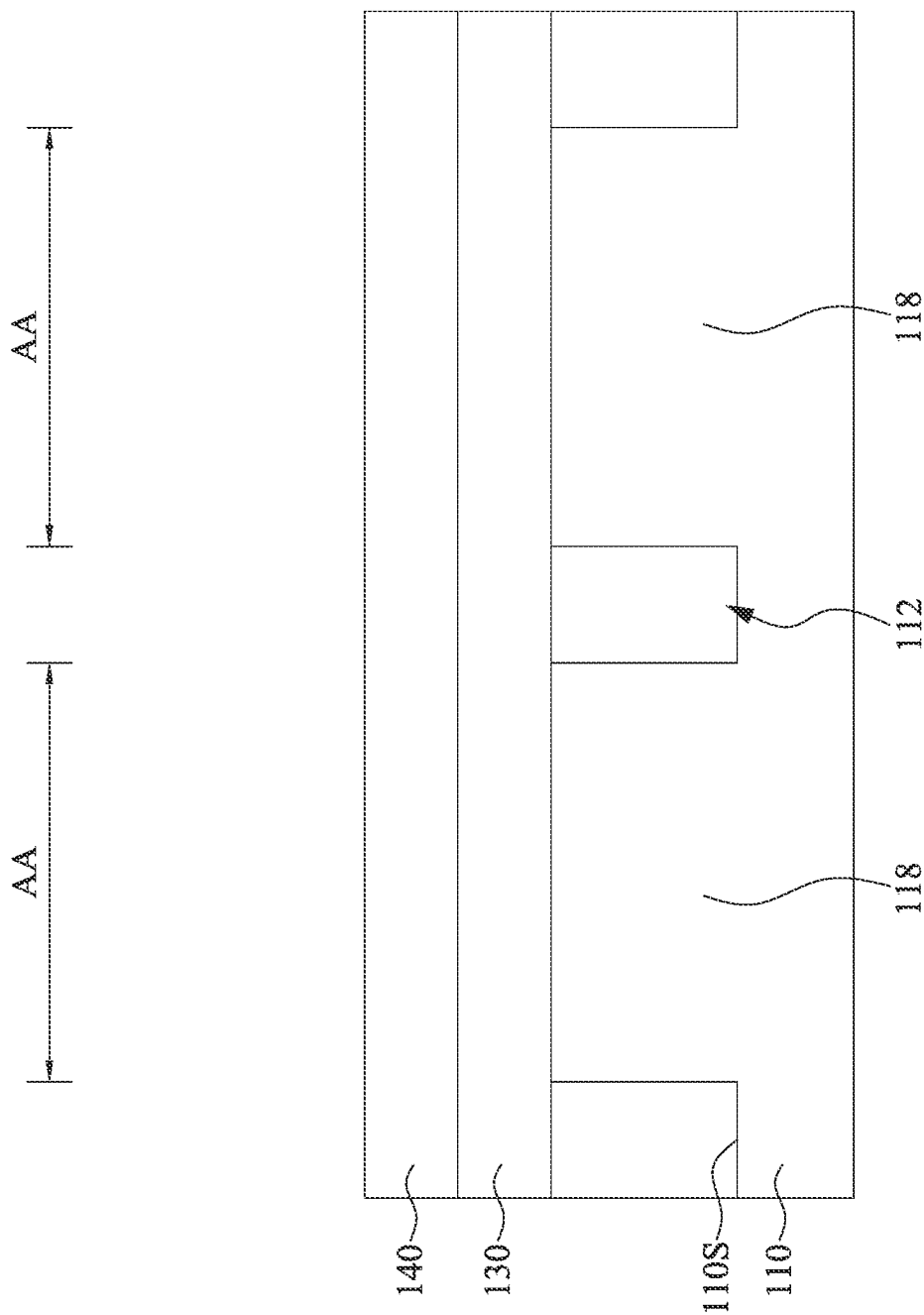

Reference is made to FIGS. 16A and 16B. FIG. 16B is a cross-sectional view taken along line 16B-16B of FIG. 16A. A semiconductor layer 130 is formed over the exposed top surface of the semiconductor substrate 110 and top surfaces of the isolation structures 122 in an amorphous state. The semiconductor layer 130 may be made of Ge, SiGe, GaAs, InGaAs, InAs, GaN, InP, GaSb, or the like. For example, the semiconductor layer 130 may be an amorphous germanium (a-Ge) layer. The formation of the semiconductor layer 130 may include a sputtering deposition process.

After the formation of the semiconductor layer 130, a capping layer 140 is formed over the semiconductor layer 130. The capping layer 140 may be made of nitride materials, such as $Si_3N_4$, and/or oxide materials, such as $SiO_2$. The capping layer 140 may be formed by chemical vapor deposition (CVD), sputtering, furnace, or the like. Other detail of the formation of the semiconductor layer 130 and the capping layer 140 are similar to those mentioned in FIGS. 3A and 3B, and not repeated herein.

Figure 17A:
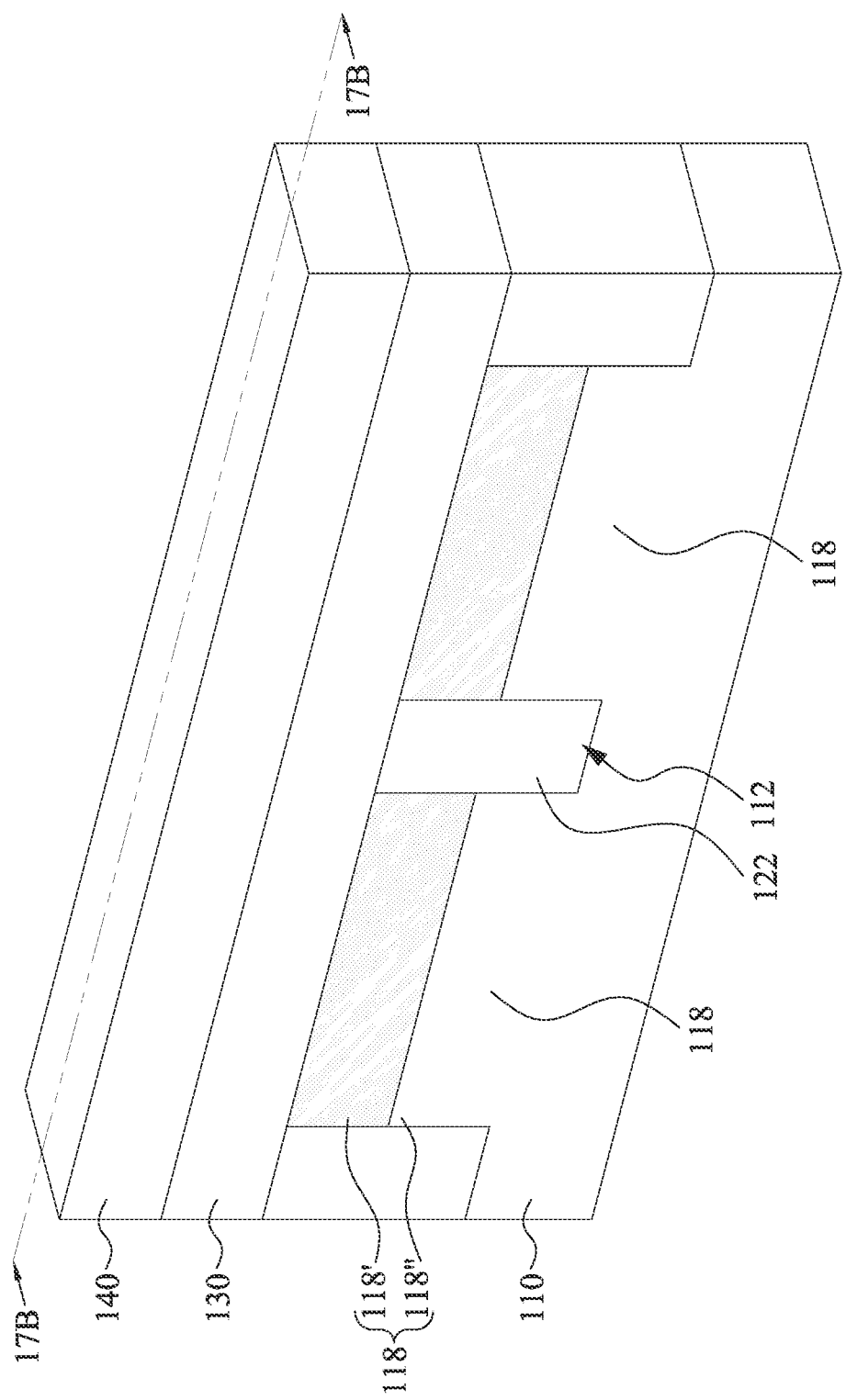
Figure 17B:
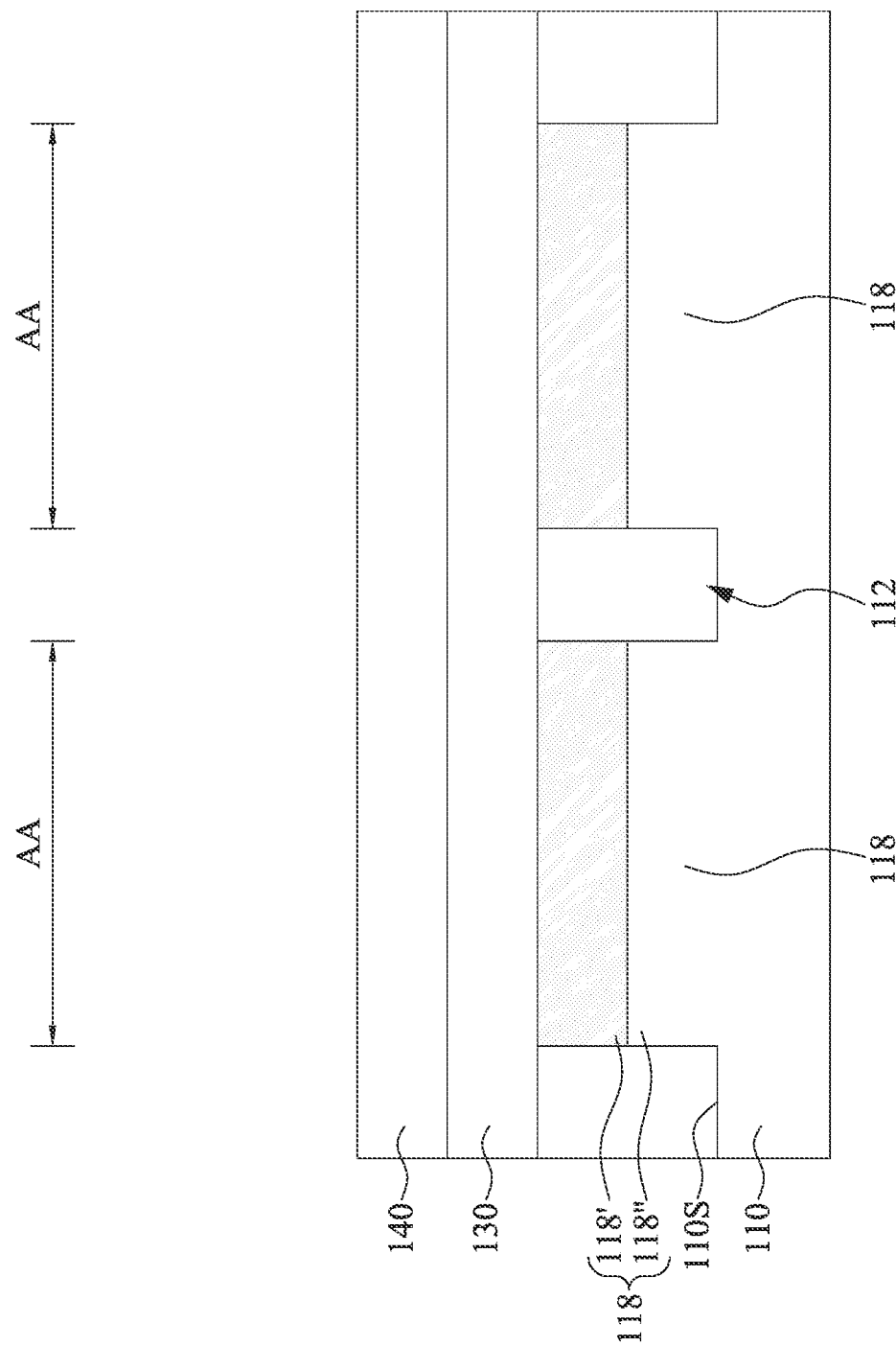

Reference is made to FIGS. 17A and 17B. FIG. 17B is a cross-sectional view taken along line 17B-17B of FIG. 17A. A thermal treatment is performed to the structure shown in FIGS. 16A and 16B, to diffuse the germanium atoms from the semiconductor layer 130 into the semiconductor substrate 110, such that at least one portion of the semiconductor substrate 110 adjacent to the semiconductor layer 130 turns to contain germanium atoms. For example, the protruding portions 118 of the substrate 110 has a diffused portion 118' containing germanium atoms after the thermal treatment. In some examples, the germanium atom concentration of the diffused portion 118' may decrease from the semiconductor layer 130 toward the bottom surface of the substrate 110. For example, the diffused portion 118' contain $Si_{1-x}Ge_x$, in which x is in a range of 0 to 1, and x decreases from the semiconductor layer 130 toward the bottom surface of the substrate 110. In some embodiments, little germanium atoms diffuse to a remaining portion 118" of the protruding portions 118 at a position lower than the diffused portion 118', such that the remaining portion 118" may not contain germanium atoms. For example, the diffused portion 118' contain SiGe, while the remaining portion 118" contain Si. In some other embodiments, the protruding portions 118 (referring to FIGS. 16A and 16B) may be entirely diffused and turned into the diffused portion 118', rather than remaining the portion 118" shown in FIGS. 17A and 17B.

Figure 18A:
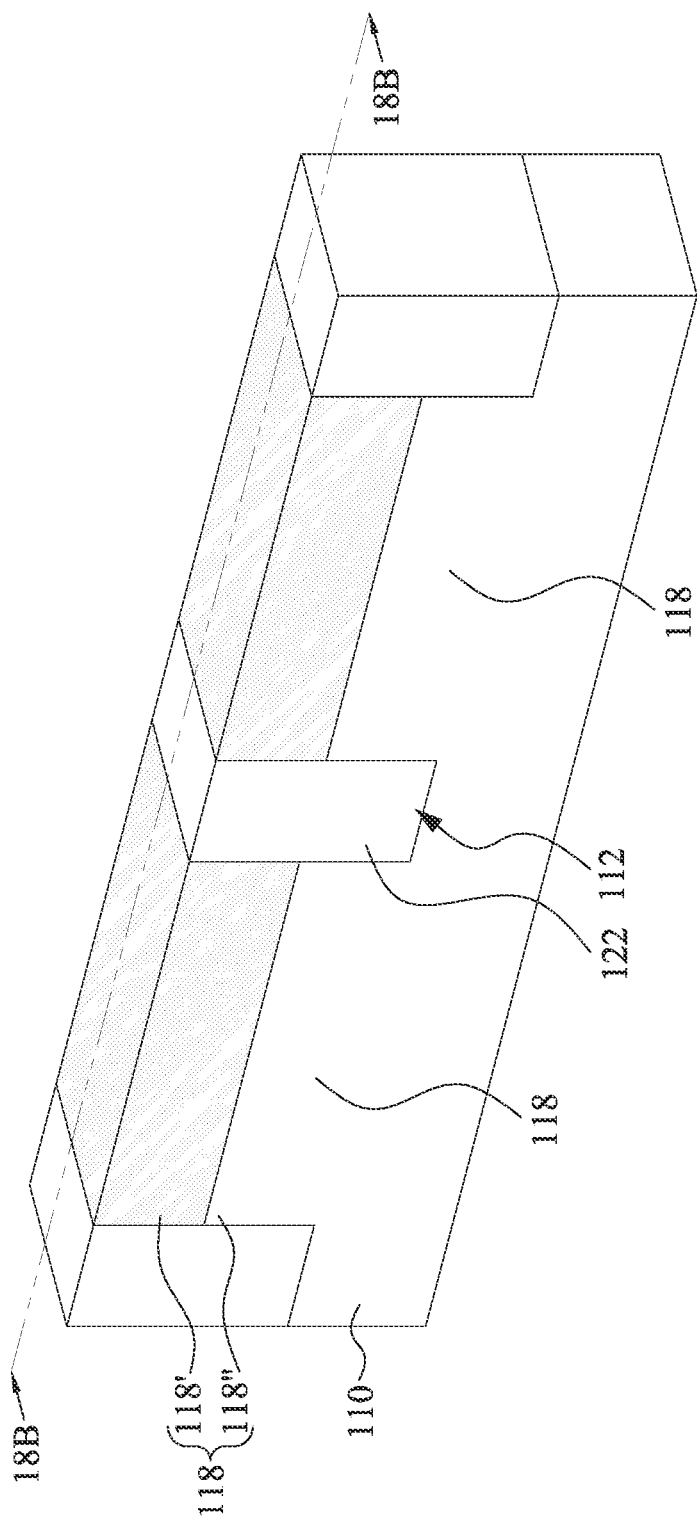
Figure 18B:
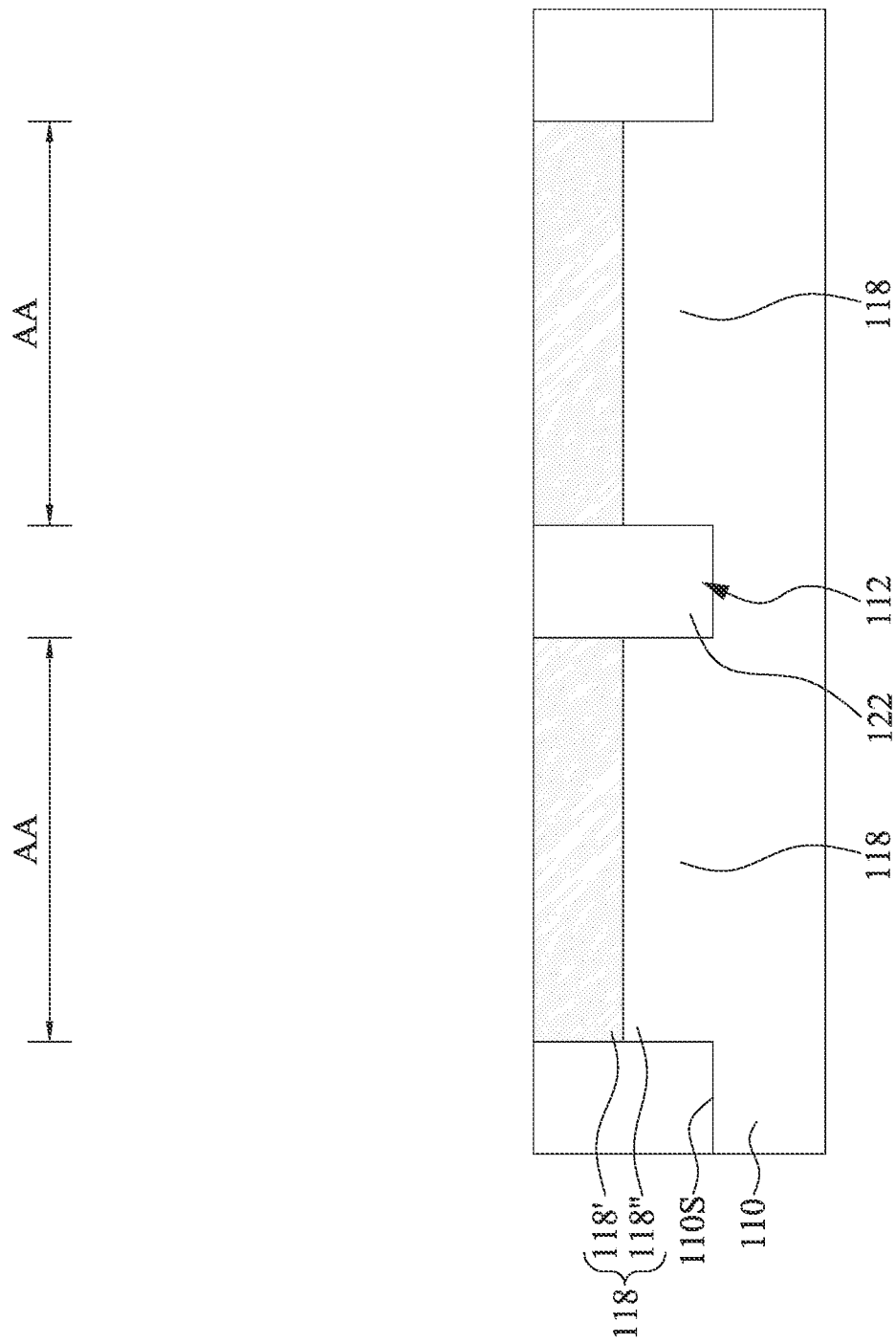

Reference is made to FIGS. 18A and 18B. FIG. 18B is a cross-sectional view taken along line 18B-18B of FIG. 18A. The semiconductor layer 130 and the capping layer 140 are removed from the diffused portion 118'. The removal of the semiconductor layer 130 and the capping layer 140 may include an etch back process and a chemical planarization process. For example, one of the etch back processes is performed to remove the capping layer 140 using etchants, such as fluorine-based etching gas (e.g., HF and BOE), and chlorine-based etching gas. Subsequently, another one of the etch back process is performed to remove the semiconductor layer 130 using etchants, such as $NH_3OH/H_2O_2/H_2O$, $HCl/H_2O_2/H_2O$, and chlorine-based etching gas. Afterwards, the chemical planarization process is performed to planarize the top surface of the diffused portion 118' and the isolation structures 122.

Figure 19A:
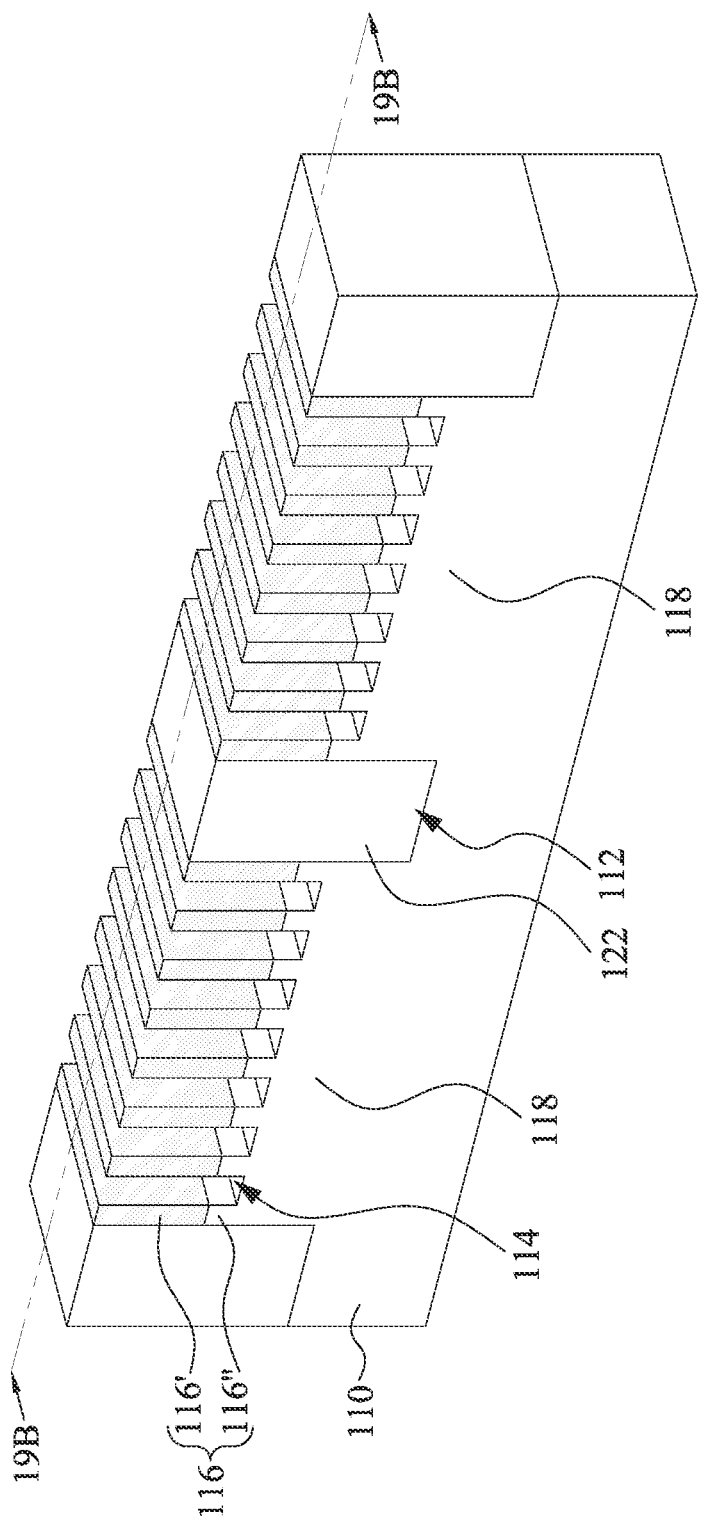

Reference is made to FIGS. 19A and 19B. FIG. 19B is a cross-sectional view taken along line 19B-19B of FIG. 19A. Trenches 114 are formed in the areas AA for defining individual fins 116 in the areas AA from those portions of the substrate 110 that remain unremoved. These semiconductor fins 116 may be used, as discussed below, to form the channel region of the semiconductor device. To be specific, plural fins 116 are formed in the protruding portions 118 including portions 118' and 118" (referring to FIGS. 18A and 18B). The fins 116 may include portions 116' formed in the diffused portions 118' (referring to FIGS. 18A and 18B) and portions 116" formed in the portions 118" (referring to FIGS. 18A and 18B). The trenches 114 may be formed using a similar process as the trenches 112 such as a suitable masking or photolithography process followed by an etching process. Additionally, during the formation of the trenches 114, the trenches 112 may be deepened, such that the trenches 112 extend into the substrate 110 a further distance than the trenches 114. That is, the trenches 112 are deeper than the trenches 114, and a bottom surface of the trench 112 is lower than a bottom surface of the trenches 114. This may be done by using a suitable mask to expose both the trenches 112 as well as those areas of the substrate 110 that will be removed to form the trenches 114. It is noted that although in FIGS. 19A and 19B the trenches 112 and 114 have sharp corners, in some other embodiments, the trenches 112 and 114 may have round corners depending on the etching conditions.

Figure 20A:
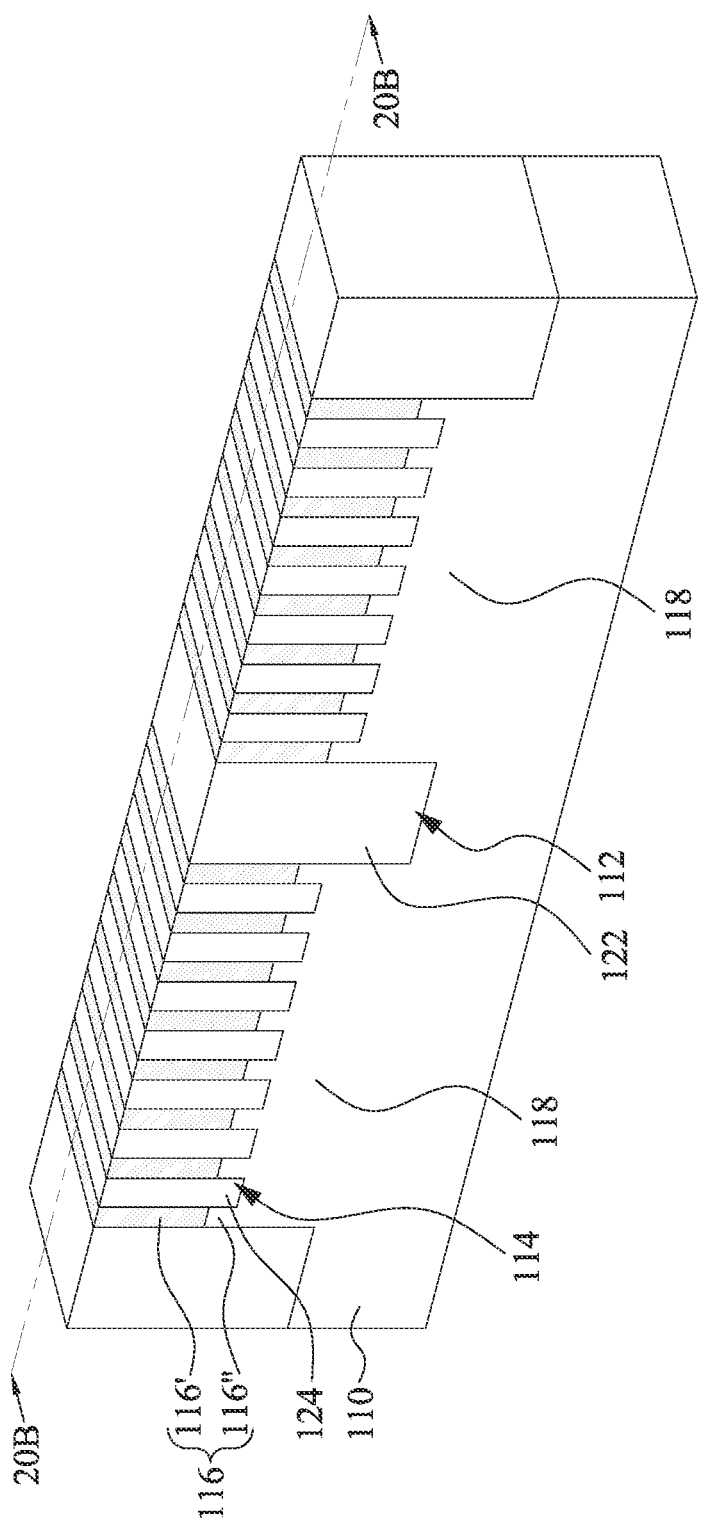
Figure 20B:
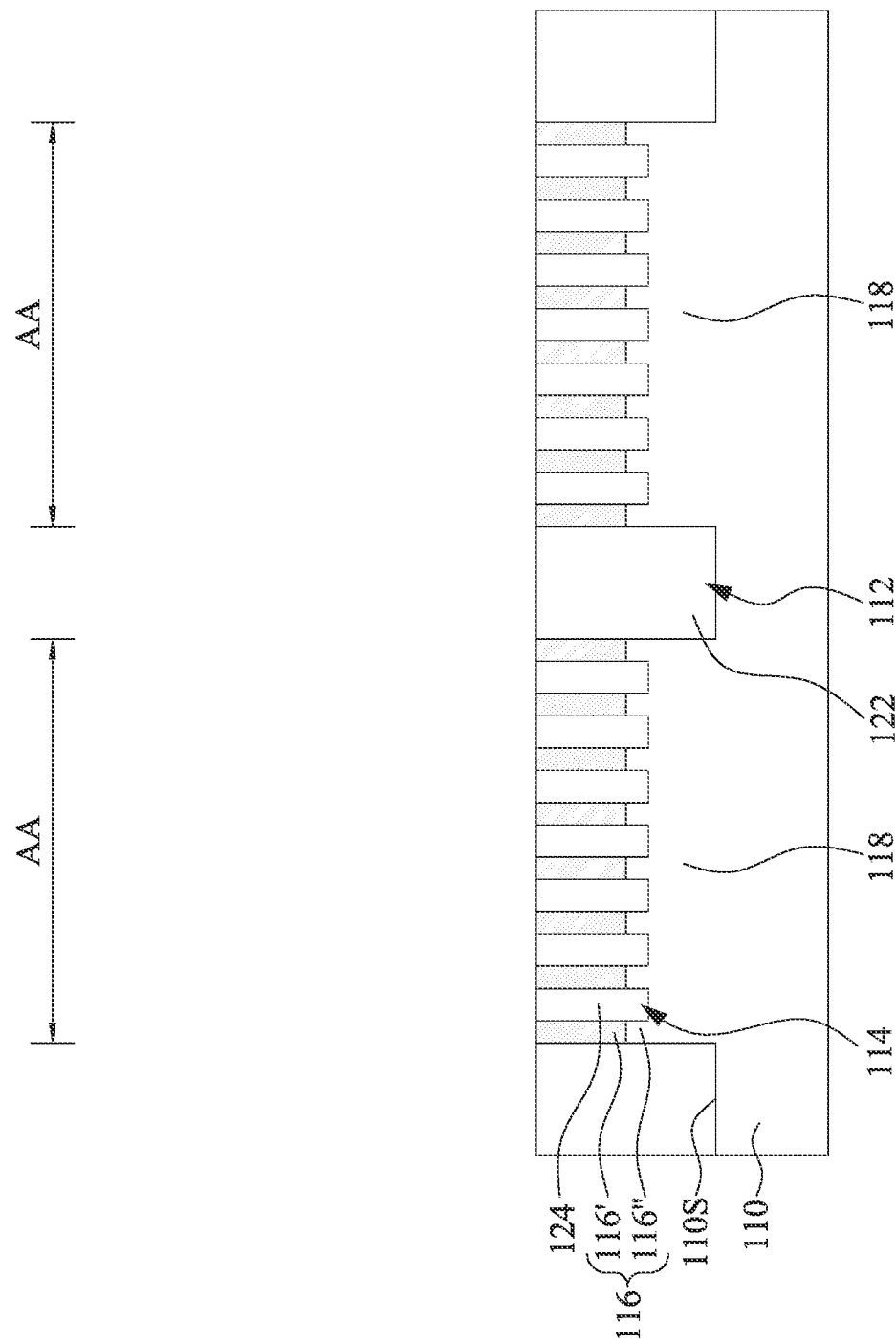

Reference is made to FIGS. 20A and 20B. FIG. 20B is a cross-sectional view taken along line 20B-20B of FIG. 20A. The trenches 114 are overfilled with a dielectric material, and then a planarization process is performed to remove portions of the dielectric material out of the trenches 114, such that top surfaces of the semiconductor fins 116 are exposed. The dielectric material respectively forms intra-device isolation structures 124 in the trenches 114. In some embodiments, the inter-device isolation structures 122 extend into the substrate 110 further than the intra-device isolation structures 124. In other words, a bottom surface of the inter-device isolation structures 122 is lower than a bottom surface of the intra-device isolation structures 124. The intra-device isolation structures 124 define a plurality of the semiconductor fins 116 on the protruding portions 118. The dielectric material may be an oxide material, a high-density plasma (HDP) oxide, or the like. The dielectric material may be formed, after an optional cleaning and lining of the trenches 112 and 114, using a CVD method (e.g., the high aspect ratio process (HARP) process), a high-density plasma CVD method, or other suitable method of formation as is known in the art. The planarization process may include a chemical-mechanical polish (CMP) process.

Figure 21A:
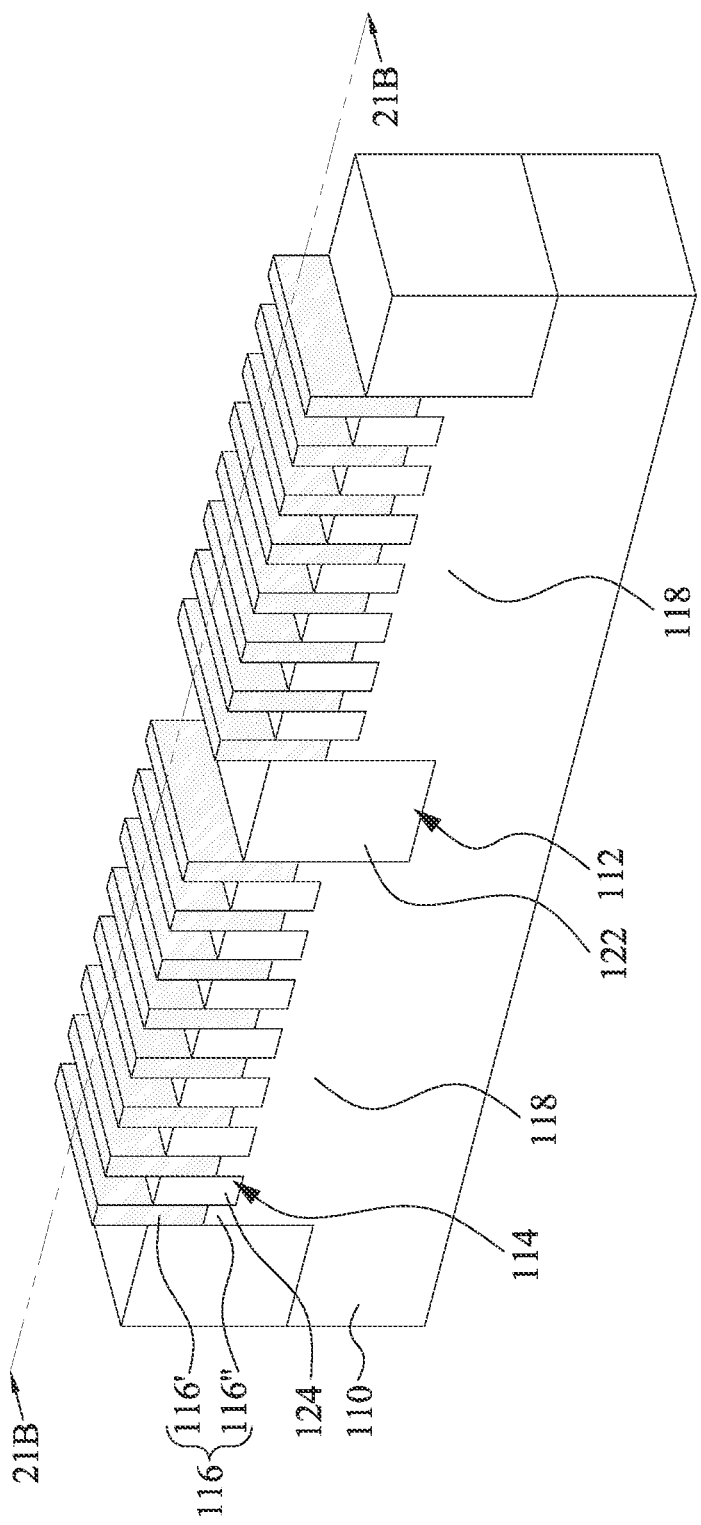
Figure 21B:
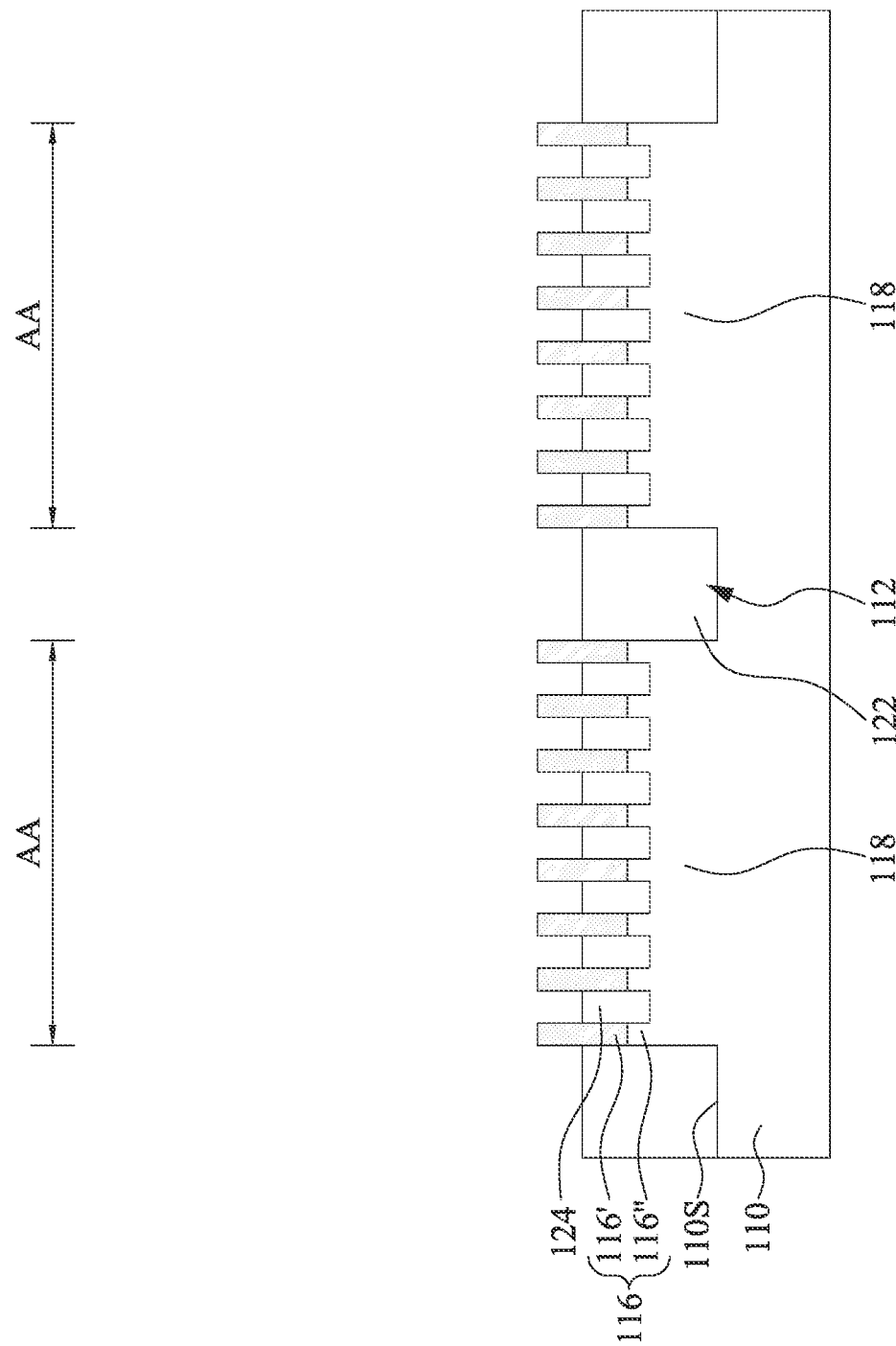

Reference is made to FIGS. 21A and 21B. FIG. 21B is a cross-sectional view taken along line 21B-21B of FIG. 21A. The isolation structures 122 and 124 are recessed by suitable etch back process, such that the diffused portion 116' of the semiconductor fins 116 protrude above the isolation structures 122 and 124. Other derails of the recessing are similar to those mentioned in FIGS. 6A and 6B, and therefore not repeated herein.

Figure 22A:
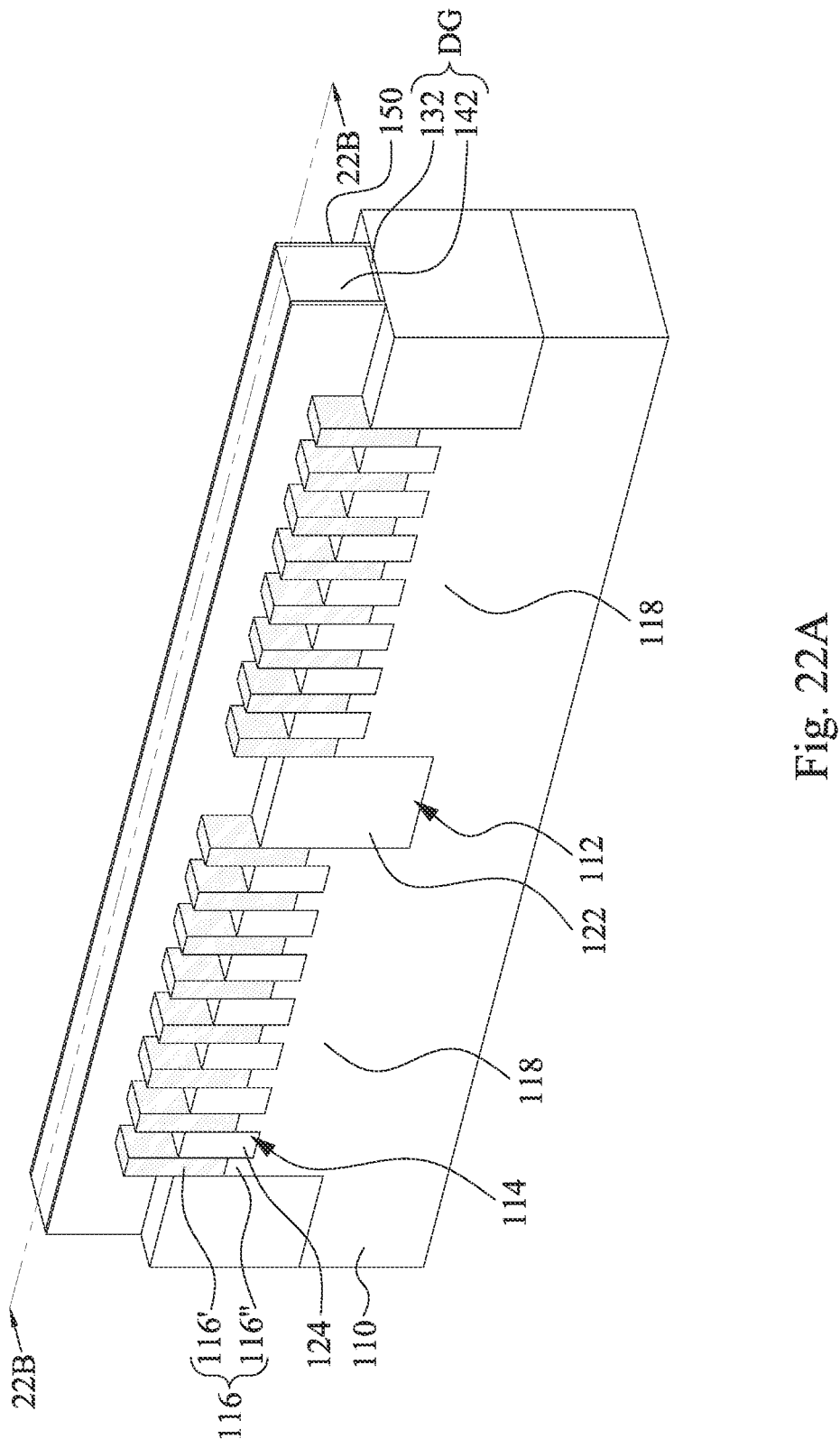
Figure 22B:
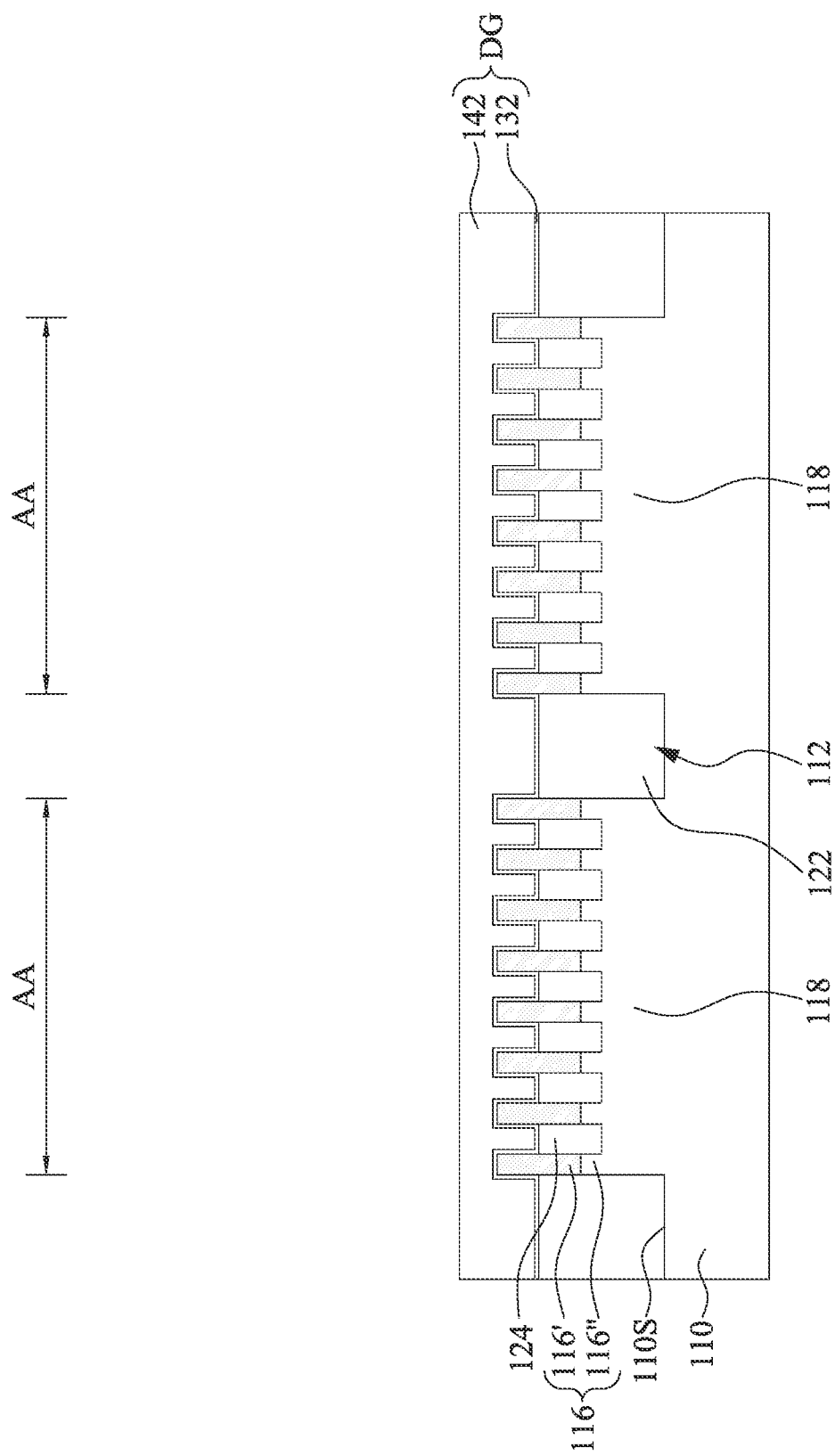

Reference is made to FIGS. 22A and 22B. FIG. 22B is a cross-sectional view taken along line 22B-22B of FIG. 22A. At least one dummy gate structure DG is formed around the semiconductor fins 116 of the substrate 110. In some embodiments, the dummy gate structure DG includes a dummy gate 142 and a gate dielectric 132 underlying the dummy gate 142. Gate spacers 150 may be formed on opposite sidewalls of the dummy gate structure DG. Other details of the formation of the dummy gate structure DG and the gate spacers 150 are similar to those mentioned in FIGS. 7A and 7B, and not repeated herein.

Figure 23:
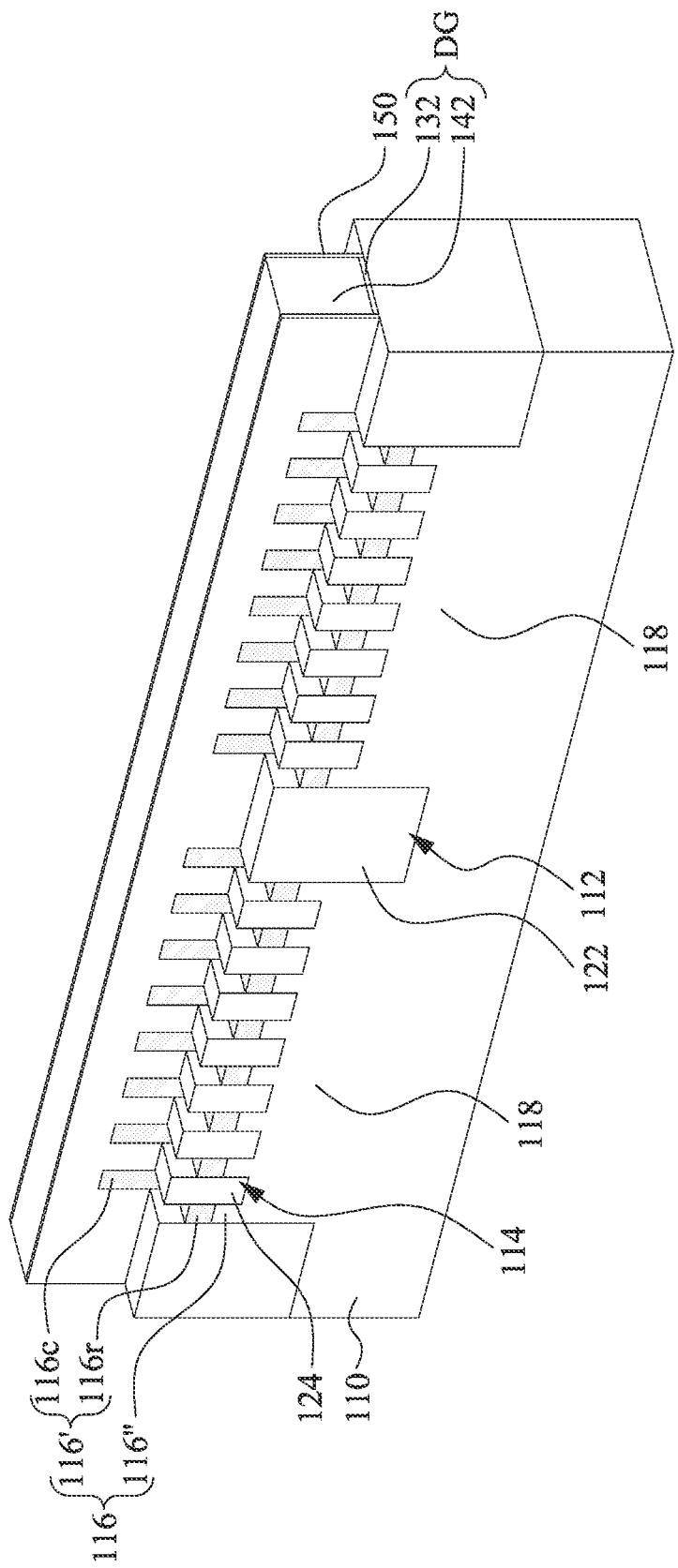

Reference is made to FIG. 23. Portions of the diffused portion 116' of the semiconductor fin 116 uncovered by the dummy gate structure DG are removed, such that each of the remaining diffused portion 116' include a recessed portion 116r uncovered by the dummy gate structure DG and a channel portion 112c covered by the dummy gate structure DG, respectively. Other details of recessing the semiconductor fin 116 are similar to those mentioned in FIG. 8, and not repeated herein.

Figure 24:
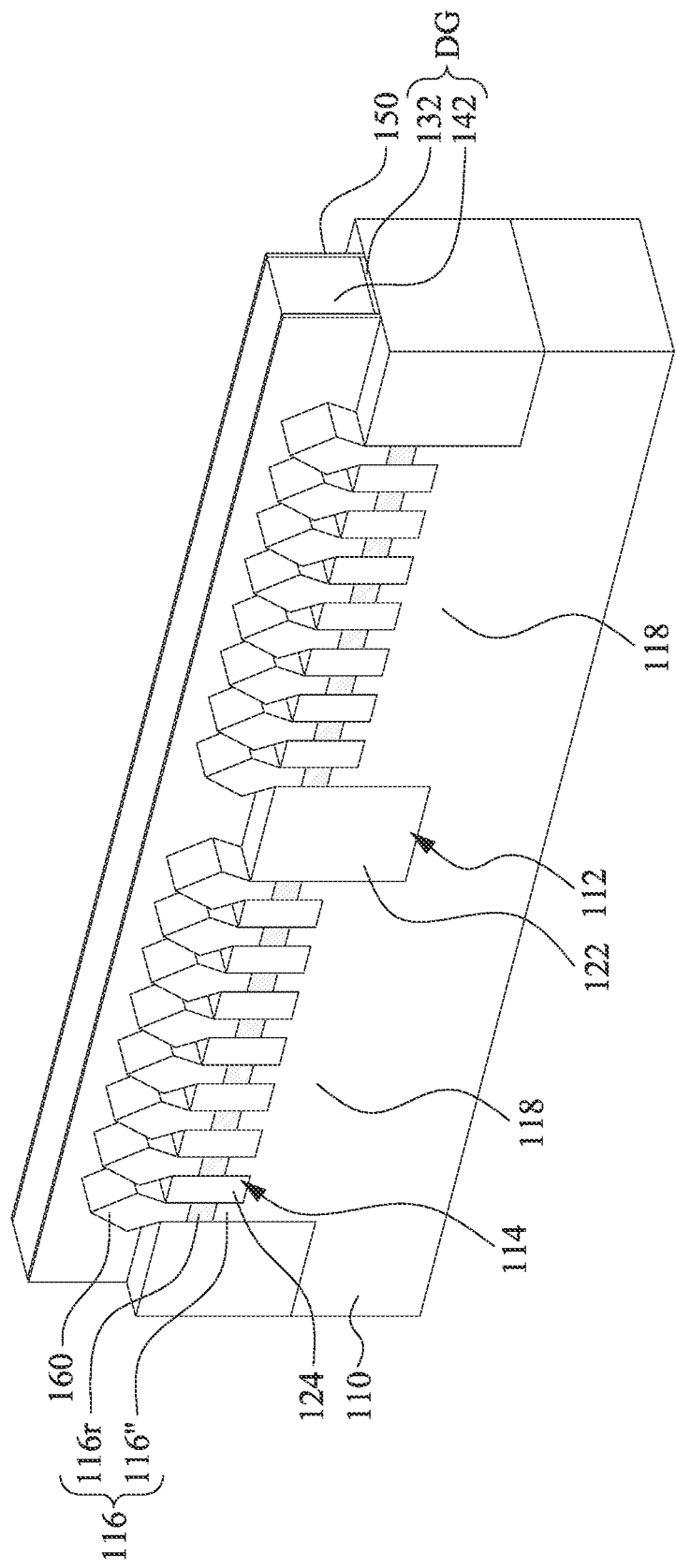

Reference is made to FIG. 24. Source/drain features 160 may be respectively formed on the recess portions 116r of the semiconductor fins 116. Other details of the formation of the source/drain features 160 are similar to those mentioned in FIG. 9, and not repeated herein.

Figure 25:
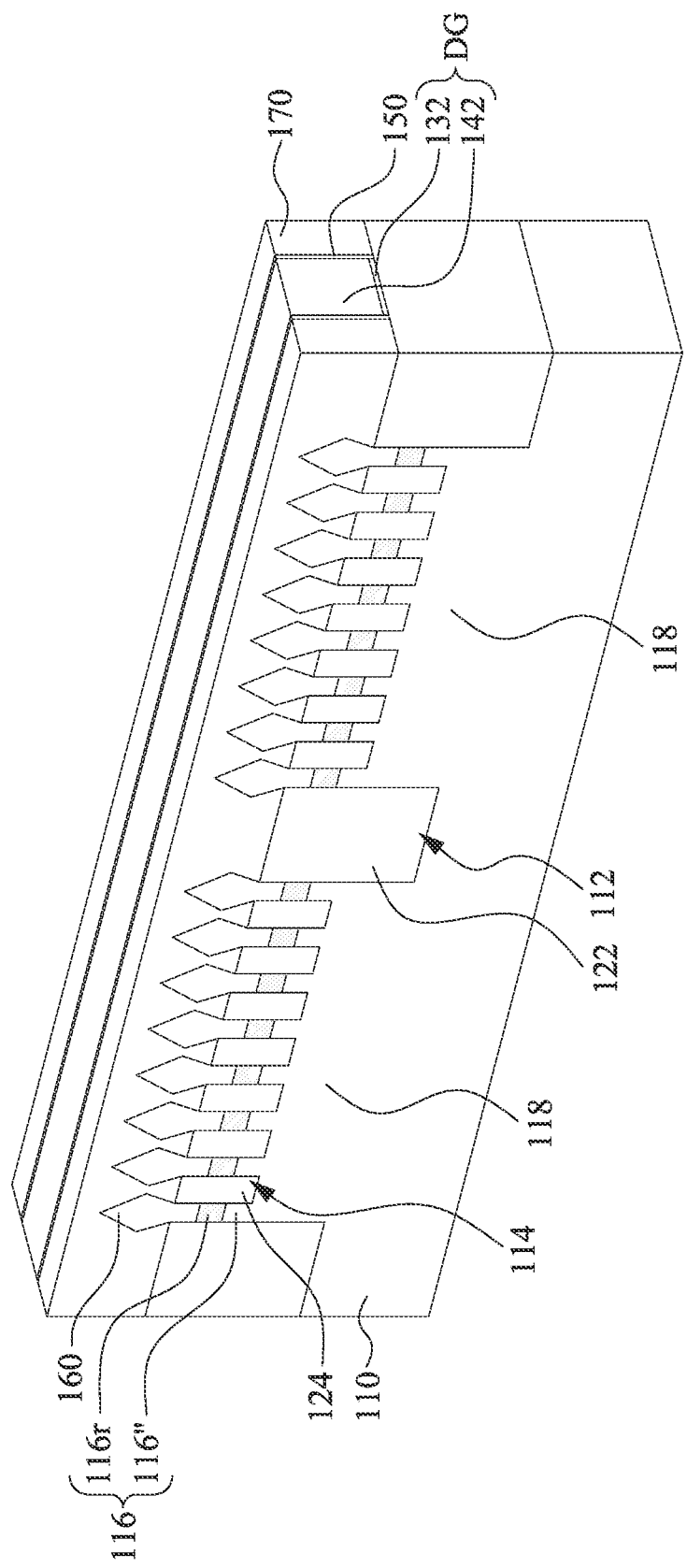

Reference is made to FIG. 25. An ILD 170 is formed over the substrate 110 and surrounding the source/drain features 160. Other details of the formation of the ILD 170 are similar to those mentioned in FIG. 10, and not repeated herein.

Figure 26A:
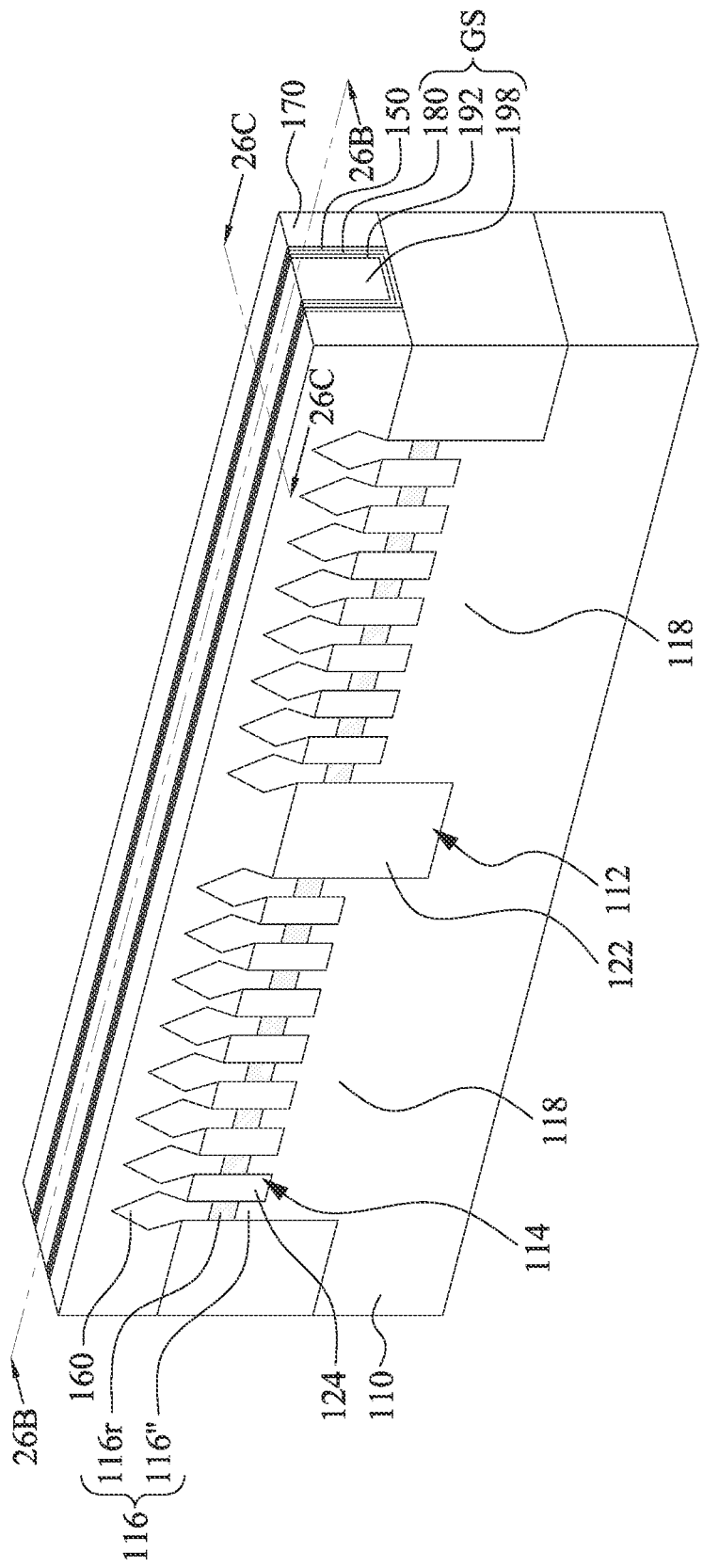
Figure 26B:
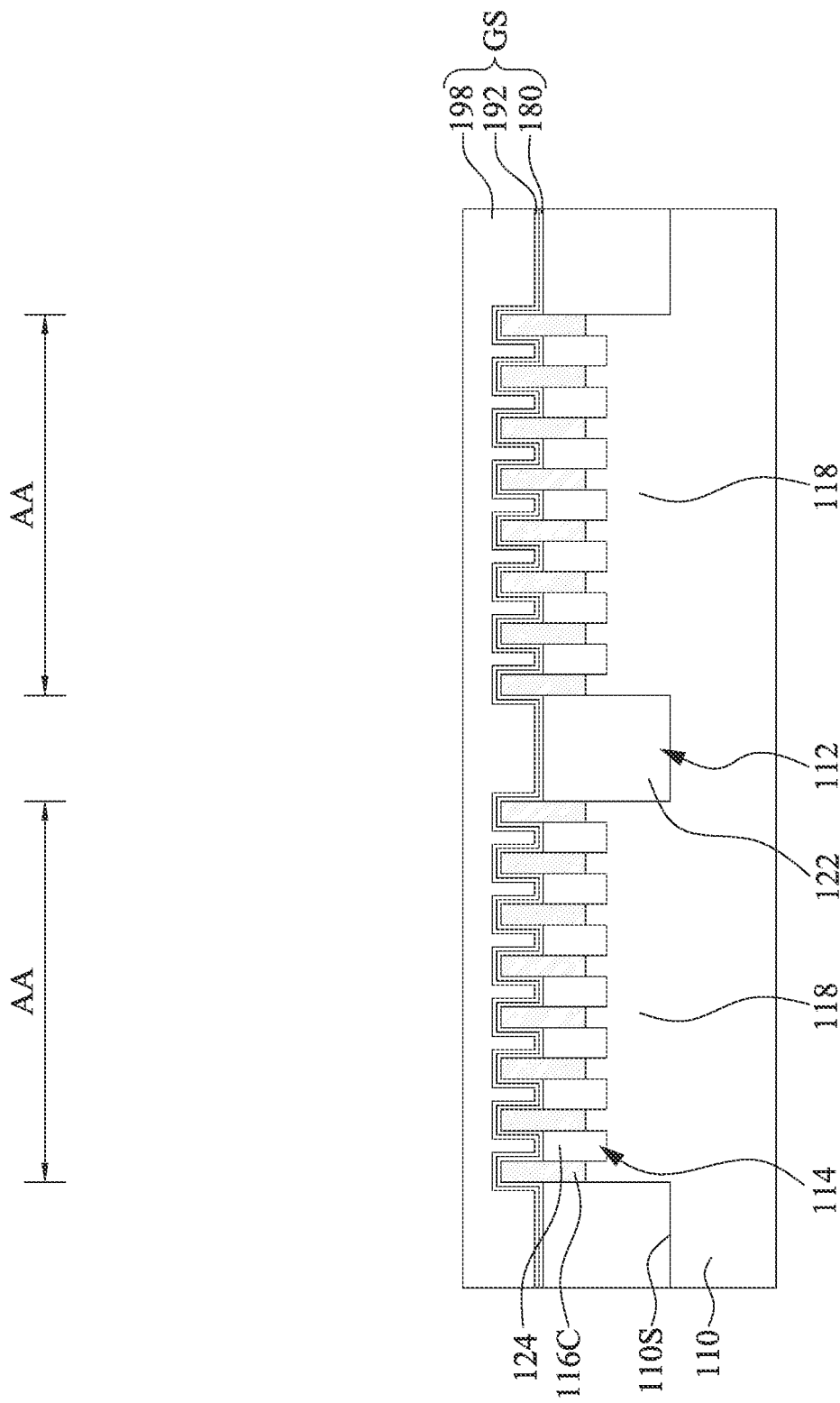

Reference is made to FIGS. 26A-26C. FIG. 26B is a cross-sectional view taken along line 26B-26B of FIG. 26A. FIG. 26C is a cross-sectional view taken along line 26C-26C of FIG. 26A. A replacement gate process is performed to replace the dummy gate structure DG with the gate structure GS. The gate structure GS includes a gate dielectric layer 180, a work function metal layer 192, and a filling conductor 198. Other details of the replacement gate process are similar to those mentioned in FIGS. 11A-11C, and not repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that silicon germanium is formed by diffusing germanium into a silicon substrate, thereby preventing kinks at corners resulting from etching the silicon substrate and defects resulting from hetero-epitaxially growing silicon germanium on the etched silicon substrate. Another advantage is that the silicon germanium can be formed on plural wafers at the same time, thereby saving fabrication cost. Still another advantage is that since it is easy to fabricate high-quality germanium sputtering targets (e.g., with few purities therein), the sputtered germanium can be formed with high quality, such that while the time and temperature of the thermal treatment can be precisely control, the silicon germanium formed by diffusing the sputtered germanium into the silicon substrate under the thermal treatment is more uniform than hetero-epitaxially grown silicon germanium (e.g., formed by hetero-epitaxy CVD). Still another advantage is that the manufacturing process is compatible with the fabrication of FinFET devices.

According to some embodiments of the present disclosure, a method for manufacturing a semiconductor device is provided. The method includes depositing a germanium layer over a silicon substrate; forming an oxide capping layer over the germanium layer; after forming the oxide capping layer, annealing the germanium layer to diffuse germanium atoms of the germanium layer into the silicon substrate, such that a portion of the silicon substrate is turned into a silicon germanium layer; and forming a gate structure over the silicon germanium layer.

According to some embodiments of the present disclosure, a method for manufacturing a semiconductor device is provided. The method includes depositing a germanium layer over a silicon substrate; forming an oxide capping layer over the germanium layer; after forming the oxide capping layer, annealing the germanium layer to diffuse germanium atoms of the germanium layer into the silicon substrate, such that a portion of the silicon substrate is turned into a silicon germanium layer; and forming a gate structure over the silicon germanium layer.

According to some embodiments of the present disclosure, a method for manufacturing a semiconductor device is provided. The method includes forming an isolation structure in a semiconductor substrate; depositing an elementary semiconductor layer over the isolation structure and the semiconductor substrate; forming a dielectric capping layer over the semiconductor layer; after forming the dielectric capping layer, performing an annealing process to turn a top portion of the semiconductor substrate into a compound semiconductor layer by diffusing atoms of the elementary semiconductor layer into the semiconductor substrate; and forming a gate structure over the compound semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:
 forming a first isolation structure and a second isolation structure in a silicon substrate, wherein the first and second isolation structures surround a silicon portion of the silicon substrate;
 depositing a germanium layer over the silicon substrate, wherein the germanium layer extends beyond an entire width of the first isolation structure;
 forming an oxide capping layer over the germanium layer;
 after forming the oxide capping layer, annealing the germanium layer to diffuse germanium atoms of the germanium layer into the silicon substrate, such that the silicon portion of the silicon substrate surrounded by the first and second isolation structures is turned into a silicon germanium layer, wherein the silicon germanium layer continuously extends from a sidewall of the first isolation structure to a sidewall of the second isolation structure;
 after forming the oxide capping layer, etching the silicon germanium layer to form a plurality of trenches;
 depositing a dielectric material into the plurality of trenches to form inter-device isolation structures; and
 forming a gate structure over the silicon germanium layer and the inter-device isolation structures.

2. The method of claim 1, wherein annealing the germanium layer is performed such that a thickness of the oxide capping layer remains substantially the same.

3. The method of claim 1, wherein the germanium layer is deposited without silicon.

4. The method of claim 1, wherein the silicon substrate is a silicon-on-insulator (SOI) substrate comprising a semiconductor layer of the SOI substrate, and a thickness of the semiconductor layer of the SOI substrate is less than a thickness of the deposited germanium layer.

5. The method of claim 4, wherein annealing the germanium layer is performed such that the semiconductor layer of the SOI substrate is turned into the silicon germanium layer.

6. The method of claim 4, wherein annealing the germanium layer is performed such that a thickness of the silicon germanium layer is substantially equal to a thickness of the semiconductor layer of the SOI substrate.

7. The method of claim 1, further comprising:
removing the oxide capping layer and the germanium layer from the silicon germanium layer after annealing the germanium layer and prior to forming the gate structure.

8. A method for manufacturing a semiconductor device, the method comprising:
forming an intra-device isolation structure in a semiconductor substrate;
depositing an elementary semiconductor layer over the intra-device isolation structure and the semiconductor substrate, wherein the elementary semiconductor layer extends beyond an entire width of the intra-device isolation structure;
forming a dielectric capping layer over the elementary semiconductor layer;
after forming the dielectric capping layer, performing an annealing process to turn a top portion of the semiconductor substrate into a compound semiconductor layer by diffusing atoms of the elementary semiconductor layer into the semiconductor substrate;
after forming the dielectric capping layer, etching the compound semiconductor layer to form a plurality of trenches;
depositing a dielectric material into the plurality of trenches to form inter-device isolation structures; and
forming a gate structure over the compound semiconductor layer and the inter-device isolation structures.

9. The method of claim 8, wherein the dielectric capping layer is an oxide layer.

10. The method of claim 8, wherein the dielectric capping layer is a nitride layer.

11. The method of claim 8, wherein the annealing process is performed such that a thickness of the dielectric capping layer remains substantially the same.

12. The method of claim 8, wherein the annealing process is performed such that a bottom of the compound semiconductor layer is higher than a bottom surface of the intra-device isolation structure.

13. The method of claim 8, wherein a melting point of the dielectric capping layer is greater than a melting point of the elementary semiconductor layer.

14. A method for manufacturing a semiconductor device, the method comprising:
forming a first isolation structure and a second isolation structure in a semiconductor substrate, wherein the first and second isolation structures surrounds a portion of the semiconductor substrate;
depositing a semiconductor layer over the semiconductor substrate and the first and second isolation structures, wherein the semiconductor layer extends beyond an entire width of the first isolation structure;
forming a dielectric capping layer over the semiconductor layer;
after forming the dielectric capping layer, annealing the semiconductor layer at a temperature greater than a melting point of the semiconductor layer, such that the portion of the semiconductor substrate surrounded by the first and second isolation structures is turned into a compound semiconductor layer, wherein the compound semiconductor layer continuously extends from a sidewall of the first isolation structure to a sidewall of the second isolation structure;
after forming the dielectric capping layer, etching the compound semiconductor layer to form a plurality of trenches;
depositing a dielectric material into the plurality of trenches to form inter-device isolation structures;
forming a gate structure over a first portion of the compound semiconductor layer and the inter-device isolation structures; and
forming a source/drain feature over a second portion of the compound semiconductor layer.

15. The method of claim 14, wherein annealing the semiconductor layer is performed when an entire top surface of the semiconductor layer is covered by the dielectric capping layer.

16. The method of claim 14, wherein a melting point of the dielectric capping layer is greater than the temperature.

17. The method of claim 14, wherein a melting point of the portion of the semiconductor substrate surrounded by the first and second isolation structures is greater than the temperature.

18. The method of claim 14, wherein depositing the semiconductor layer comprises:
performing a sputtering deposition process using a target comprising an elementary semiconductor material.

19. The method of claim 14, wherein depositing the semiconductor layer is performed such that the semiconductor layer is in contact with a top surface of the first isolation structure and a top surface of the second isolation structure.

20. The method of claim 14, wherein the semiconductor layer extends beyond an entire width of the second isolation structure.

* * * * *